US011905592B2

(12) United States Patent
Biedermann et al.

(10) Patent No.: US 11,905,592 B2
(45) Date of Patent: Feb. 20, 2024

(54) METHOD AND CONTROL DEVICE

(71) Applicant: VON ARDENNE Asset GmbH & Co. KG, Dresden (DE)

(72) Inventors: Ralf Biedermann, Dresden (DE); Bernd Teichert, Dresden (DE); Thomas Meyer, Dresden (DE); Torsten Dsaak, Dresden (DE)

( * ) Notice: Subject to any disclaimer, the term of this patent is extended or adjusted under 35 U.S.C. 154(b) by 485 days.

(21) Appl. No.: 17/009,788

(22) Filed: Sep. 2, 2020

(65) Prior Publication Data

US 2021/0062327 A1 Mar. 4, 2021

(30) Foreign Application Priority Data

Sep. 2, 2019 (DE) ...................... 10 2019 123 410.7

(51) Int. Cl.
*C23C 14/54* (2006.01)
*C23C 14/24* (2006.01)

(52) U.S. Cl.
CPC .............. *C23C 14/54* (2013.01); *C23C 14/24* (2013.01)

(58) Field of Classification Search
None
See application file for complete search history.

(56) References Cited

U.S. PATENT DOCUMENTS

2019/0226092 A1 7/2019 Mosshammer

FOREIGN PATENT DOCUMENTS

DE 102018101173 A1 7/2019

OTHER PUBLICATIONS

German Office Action issued for the corresponding DE application No. 10 2019 123 410.7, dated Apr. 16, 2020, 6 pages (for informational purpose only).

*Primary Examiner* — Shamim Ahmed
*Assistant Examiner* — Bradford M Gates
(74) *Attorney, Agent, or Firm* — Viering, Jentschura & Partner mbB

(57) ABSTRACT

In various aspects of the disclosure, a method of operating a process group that performs at least a first reactive coating process and a second reactive coating process may comprise: coating of a substrate by means of the first reactive coating process and by means of the second reactive coating process; closed-loop control of the process group by means of a first manipulated variable of the first coating process and a second manipulated variable of the second coating process and using a correction element; wherein the correction element relates the first manipulated variable and the second manipulated variable to one another in such a way that their control values are different from one another.

17 Claims, 13 Drawing Sheets

FIG. 9

|  | k=a | k=b | k=c | k=d |
|---|---|---|---|---|
| $F_k$ | 1000 | 0 | 0 | 0 |
| $P_k$ | 9.70E-03 | 7.00E-03 | 5.90E-03 | 5.10E-03 |
| $X_k$ | 1034 | 380 | 166 | 20 |
| $Y_k$ | 1.000 | 0.368 | 0.160 | 0.019 |
| $F_k$ | 0 | 1000 | 0 | 0 |
| $P_k$ | 6.50E-03 | 1.05E-02 | 6.70E-03 | 5.30E-03 |
| $X_k$ | 330 | 1045 | 313 | 60 |
| $Y_k$ | 0.316 | 1.000 | 0.299 | 0.057 |
| $F_k$ | 0 | 0 | 1000 | 0 |
| $P_k$ | 5.20E-03 | 7.10E-03 | 1.09E-02 | 7.30E-03 |
| $X_k$ | 44 | 399 | 1086 | 460 |
| $Y_k$ | 0.041 | 0.368 | 1.000 | 0.424 |
| $F_k$ | 0 | 0 | 0 | 1000 |
| $P_k$ | 5.05E-03 | 5.80E-03 | 6.90E-03 | 9.90E-03 |
| $X_k$ | 11 | 152 | 350 | 980 |
| $Y_k$ | 0.011 | 0.155 | 0.357 | 1.000 |

| | k=a | k=b | k=c | k=d |
|---|---|---|---|---|
| $Y_k(901a)$ | 1.000 | 0.368 | 0.160 | 0.019 |
| $Y_k(901b)$ | 0.316 | 1.000 | 0.299 | 0.057 |
| $Y_k(901c)$ | 0.041 | 0.368 | 1.000 | 0.424 |
| $Y_k(901d)$ | 0.011 | 0.155 | 0.357 | 1.000 |

1001b →

| | k=a | k=b | k=c | k=d |
|---|---|---|---|---|
| $L_k(901a)$ | 3667 | 0 | 0 | 0 |
| $L_k(901b)$ | 0 | 3167 | 0 | 0 |
| $L_k(901c)$ | 0 | 0 | 3067 | 0 |
| $L_k(901d)$ | 0 | 0 | 0 | 3333 |

93 ↑
91 →

METHOD AND CONTROL DEVICE

CROSS-CITING TO RELATED APPLICATIONS

This application claims priority to German Application 10 2019 123 410.7, which was filed on Sep. 2, 2019, the entirety of both of which is incorporated herein fully by reference.

TECHNICAL FIELD

Various working examples relate to a method and to a control device.

BACKGROUND

In general, a coating process may be utilized to apply a layer to a substrate. The coating process may be effected, for example, by means of a physical vapor deposition, for example cathodic atomization (also known as sputtering). Modifications to cathodic atomization are, for example, what is known as reactive sputtering and reactive magnetron sputtering. In reactive sputtering, on the one hand, a working gas (e.g. Ar) is used to atomize the cathode (the target material), in which case the working gas is not incorporated into the layer deposited on the substrate, and, on the other hand, at least one reactive gas with which the atomized target material chemically reacts (also referred to as coating material) is added, such that the reaction product is deposited on the substrate.

In the case of reactive sputtering, a substrate may be coated with a layer by moving the sputtering arrangement to a setpoint (also referred to as operating point) and/or holding it at that point, and a layer having the desired properties is obtained at that point. The setpoint may define a set of operating parameters of the sputtering arrangement, the interaction of which affects the properties of the layer.

In contrast to sputtering without reactive gas, which, illustratively, is generally able to run in a relatively stable manner (for example without further control mechanisms or requiring only minor interventions), sputtering under reactive gas (also referred to as reactive magnetron sputtering) may require appropriate control techniques and control equipment to control the complex interplay of the operating parameters. For some coating materials, this interplay may be particularly sensitive since, for example, firstly, the desired layer properties are attained only within a narrow range of stoichiometry and, secondly, the reaction dynamics are frequently unstable (for example bistable). Unstable reaction dynamics may, for example, cause the system to leave the desired setpoint of its own accord and/or to oscillate between two self-establishing (stable) modes of reaction.

The bistable characteristics are usually caused by positive feedback within the reaction dynamics, which intrinsically stabilizes some of the modes of reaction. In the case of reactive sputtering, for example, the sputtering cathode may react with oxygen as a reactive gas, which makes the surface thereof more resistant to the plasma and hence inhibits the atomization. As a result, less oxygen may be consumed, which leads to an excess of oxygen, which in turn more significantly oxidizes the surface of the coating material. A reduction in the amount of reactive gas reduces the excess thereof, such that the oxidation of the sputtering cathode decreases. This accelerates the atomization of the coating material and hence also increases the consumption of reactive gas before its excess is degraded and the reaction dynamics automatically change over to a metallic surface of the sputtering cathode. If, however, a reaction product that reacts incompletely is required, it is necessary to operate the sputtering process in an unstable mode of reaction (also referred to as transition mode) between the stable modes of reaction (also referred to as balance control). This mode of control is conventionally controlled for an individual coating process.

In a high-productivity coating system, multiple identical coating processes may proceed successively, such that the substrate is coated more quickly and/or with a thicker layer. Conventionally, the multiple coating processes, in terms of gas technique, are separated from one another by means of pump chambers that are disposed between two coating processes and that provide such a strong gas sink that gas exchange between the coating processes may be inhibited. This leads to a high space demand for the coating system, but prevents, illustratively, interactions between the coating processes. If space demand is to be reduced, this may impair gas separation. In the case of reduced gas separation, the coating processes may then affect one another, such that the control circuits thereof act as a disturbance variable on one another. Similar to the transition mode, this may have the effect that the system departs from the desired setpoint of its own accord and the reaction dynamics tend to shift despite being controlled.

SUMMARY

According to various aspects of the disclosure, it has been recognized that the complexity of the multiple coating processes to be controlled may be reduced by decreasing the degree of freedom of the control circuits. It is thus, illustratively, possible to provide a group control system that enables control of the multiple coating processes collectively as a group. Illustratively, for this purpose, the manipulated variables (also referred to as "control variables", as "manipulated input", as ""manipulated process parameter" or as "correcting variables") of the various coating processes are related to one another, such that they are no longer independent. Each manipulated variable may correspond to a controller output.

According to various aspects of the disclosure, a method of operating a process group that performs at least a first reactive coating process and a second reactive coating process may include: coating of a substrate by means of the first reactive coating process and by means of the second reactive coating process; closed-loop control of the process group by means of a first manipulated variable from the first coating process and a second manipulated variable from the second coating process and using a correction element; wherein the correction element (also referred to as correction member) relates the first manipulated variable and the second manipulated variable to one another in such a way that their control values are different from one another.

The difference in the control values, illustratively, compensates for the fact that the coating processes are not entirely identical, for example owing to differences in the spatial arrangement, in the respectively adjacent coating processes, in the prior utilization, owing to construction differences, etc. This difference in the coating processes could only inadequately be taken into account if the control values were identical.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed aspect of the disclosure. In the following description, various aspects of the disclosure are described with reference to the following drawings, in which FIGS. 1 and 8 a method in various aspects of the disclosure in a schematic flow diagram;

FIGS. 9 and 10 multiple correlation matrices in a schematic tabular view;

DETAILED DESCRIPTION

Figure 1:
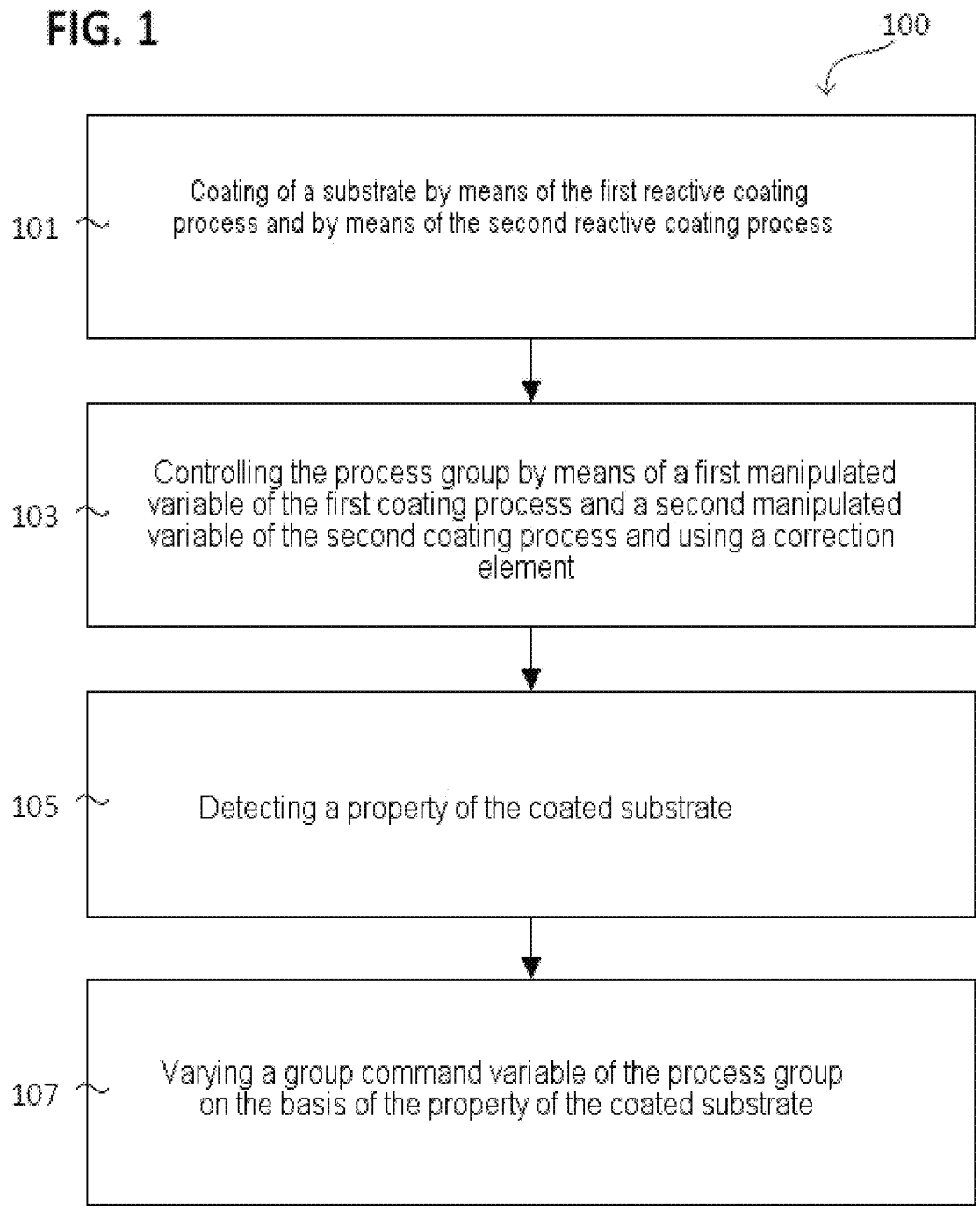

In the detailed description that follows, reference is made to the appended drawings, which form part thereof and in which specific aspects of the disclosure in which the disclosure may be executed are shown for illustration. In this regard, direction terminology, for instance "top", "bottom", "front", "back", "anterior", "posterior", etc. is used with regard to the orientation of the figure(s) described. Since components of aspects of the disclosure may be positioned in a number of different orientations, the direction terminology serves for illustration and is in no way restrictive. It will be apparent that other aspects of the disclosure may be utilized and structural or logical alterations may be made without departing from the scope of protection of the present disclosure. It will be apparent that the features of the various illustrative aspects of the disclosure described herein may be combined with one another unless specifically stated otherwise. The detailed description that follows should therefore not be interpreted in a limiting manner, and the scope of protection of the present disclosure is defined by the appended claims.

In the context of this description, the terms "connected", "attached" and "coupled" are used to describe either a direct or an indirect connection (for example ohmic and/or electrically conductive, for example an electrically conductive connection), a direct or indirect attachment and a direct or indirect coupling. In the figures, identical or similar elements are given identical reference numerals where appropriate.

In various aspects of the disclosure, the term "coupled" or "coupling" may be understood in the sense of a (mechanical, hydrostatic, thermal and/or electrical, for example), for example direct or indirect, connection and/or interaction. Multiple elements may be coupled to one another, for example, along a chain of interaction along which the interaction (for example a signal) may be transmitted. For example, two mutually coupled elements may exchange an interaction with one another, for example a mechanical, hydrostatic, thermal and/or electrical interaction. In various aspects of the disclosure, "coupled" may be understood in the sense of a mechanical (e.g. bodily or physical) coupling, for example by means of a direct physical contact. A coupling may be configured to transmit a mechanical interaction (e.g. force, torque, etc.).

A chemical compound (for example the reaction product) may be understood to mean a material consisting of atoms of two or more chemical elements (e.g. "M" and "R"). The term "stoichiometric" in connection with a material may be understood to mean that the material includes a chemical compound (e.g. $MR_{1-x}$, $MR_{2-x}$, $MR_{3-x}$, $M_2R_{3-x}$, etc.) and/or crystal lattice that has essentially no lattice vacancies (i.e. $x=0$). The lattice vacancies herein may be based on a reactive material "R", for example on oxygen and/or nitrogen. For example, a stoichiometric oxide may be essentially fully oxidized, i.e. may absorb essentially no further oxygen on heating or other chemical activation (i.e., more generally speaking, may be saturated with the reactive material). In analogy, a stoichiometric nitride may be essentially fully nitrided, i.e. may absorb essentially no further nitrogen on heating or other chemical activation.

"substoichiometric" may be understood in this connection to mean that the material has a multitude of lattice vacancies (i.e. $x>0$, e.g. $x>0.1$), for example oxygen lattice vacancies and/or nitrogen lattice vacancies. The lattice vacancies may be positions in the crystal lattice of the material that remain unoccupied. If a substoichiometric material is heated and/or chemically activated, this may occupy the lattice vacancies, for example in that it takes up the reactive material (oxygen or nitrogen) and incorporates it into its crystal lattice.

In general, a stoichiometric material may have proportionally fewer (for example essentially no) lattice vacancies than a substoichiometric material. Alternatively or additionally, the stoichiometric material may have a smaller absorption coefficient than a substoichiometric material. For example, the absorption coefficient of the material may increase with a proportionally rising number of lattice vacancies.

One process group may be part of a vacuum system that has a multitude of vacuum chambers. The vacuum chambers may be connected to one another by means of a substrate transfer opening, such that they form, for example, a common vacuum system. The vacuum system may be sealable from the outside in an essentially airtight manner, for example by means of at least one valve, at least one chamber cover, multiple seals and/or at least one transfer opening hatch.

Open-loop control may be understood to mean an intended influence on a system. The current state of the system (also referred to as "actual state", or as "instantaneous state") may be altered according to a predefined state (also referred to as target state or setpoint state). Closed-loop control may be regarded as open-loop control, wherein a change in state of the system is additionally counteracted by perturbations. Illustratively, the open-loop control system may have a feedforward control system and hence, illustratively, may implement a sequential control that converts an input parameter (for example the predefined state) to an output parameter. However, the control system may also be part of a closed-loop control circuit, such that closed-loop control is implemented. Closed-loop control, by contrast with pure feedforward control, has a continual influence of the output parameter on the input parameter which is brought about by the closed-loop control circuit (feedback). In other words, it is possible to use a closed-loop control system alternatively or additionally to the open-loop control system, or to implement a closed-loop control alternatively or additionally to the open-loop control. The state of the system (also referred to as setpoint) may be represented by one or more than one controlled variable of the system, the actual value of which represents the actual state of the system and the target value of which (also referred to as command value) represents the target state of the system. In the case of closed-loop control, an actual state of the system (for example determined on the basis of a measurement) is compared to the target state of the system, and the one or more than one controlled variable (also referred to as "process variable", as "sensed process parameter" or as "measured output") is influenced by means of a corresponding manipulated variable (using a control element) in such a way that the variance of the actual state from the target state of the system is minimized. Each controlled variable may correspond to a senor input.

In various aspects of the disclosure, it is possible to provide a group control system that collectively controls a process group of multiple (e.g. K) coating processes with a low degree of gas separation from one another (where, for example, K>1, K>5, or K>10). The multiple coating processes may correspond, for example, in terms of their coating material, their reactive gas and/or the type of coating apparatus thereof (e.g. thermal or atomizing).

For example, each coating process may have a reactive sputtering process that uses one or more than one reactive gas (e.g. m reactive gases) to deposit a chemical compound of a constituent of the or each reactive gas with the coating material on a substrate (where, for example, m=1, m>1 or m>2).

The control may be effected by means of a closed-loop control circuit having a high-speed control element (for example having a dead time of less than 1 s or than 100 ms), which may be followed downstream by one or more than one lower-speed control element (for example having a dead time of more than 1 s or than 10 s) (also referred to as cascaded).

The coating processes of the process group may, for example, be combined by means of one or more than one correlation matrix to yield a control group. The or each correlation matrix may be variably stored in a programmable logic controller (PLC).

A group target setpoint defined by the operator may be distributed by means of the PLC mathematically to the coating processes of the process group. This may be effected, for example, by using a mathematical relationship to relate the correlation matrix to the group target setpoint in such a way as to result in a corresponding target setpoint for each of the multiple coating processes.

FIG. 1 illustrates a method 100 in various aspects of the disclosure in a schematic flow diagram. The method 100 may be used to operate a process group that performs at least a first reactive coating process and a second reactive coating process.

The method 100 includes, in 101, coating of a substrate by means of the first reactive coating process and (for example thereafter) by means of the second reactive coating process; and in 103, closed-loop control of the process group by means of at least one (i.e. one or more than one) first manipulated variable (also referred to as first manipulated input or as first manipulated process parameter) of the first coating process and at least one second manipulated variable (also referred to as second manipulated input or as second manipulated process parameter) of the second coating process and using a correction element. The coating of the substrate may in each case include emitting a coating material toward the substrate, wherein the coating material is exposed to a reactive gas, and forming a layer on the substrate that includes the coating material and at least one constituent of a reactive gas.

The closed-loop control 103 may include relating by the correction element at least of the or each first manipulated variable and the or each second manipulated variable to one another in such a way that their respective control values differ from one another. The correction element may, for example, relate the or each first manipulated variable to the or each second manipulated variable by means of a relationship V in such a way that the control value $S_a$ of the or each first manipulated variable differs from the control value $S_b$ of the or each second manipulated variable. For example, the relation $V(S_a)=S_b$ may be satisfied.

The method 100 optionally includes, in 105, detecting a property of the coated substrate. The property may include, for example: a specific electrical resistivity of the layer, a chemical composition of the layer, a spatial distribution of the thickness of the layer (also referred to as layer thickness), or an optical property of the layer and/or of the coated substrate.

The method 100 optionally includes, in 107, varying a group command variable (for example in accordance with a group target setpoint) of the process group on the basis of the property of the coated substrate. The varying 107 may include varying the at least one first manipulated variable and/or the at least one second manipulated variable on the basis of the group command variable.

The closed-loop control 103 of the or each coating process may include, for example: setting or controlling an electrical supply (for example electrical supplies) to the coating process(es) (that is/are used, for example, to generate the plasma); and/or setting or controlling an inflow (for example multiple inflows) of reaction gas and/or working gas.

For example, the manipulated variable used in a coating process may be a parameter (for example the position) of a control element of the coating process by means of which the supply (for example feeding and/or withdrawal) of a medium (electrical energy, material, thermal energy, etc.) to or from the coating process is effected (also referred to as media supply). For example, for control of the or each coating process, one or more than one of the following parameters of the coating process may be used as manipulated variable of the coating process: an electrical parameter for supplying of the coating process, a chemical composition of the process gas (including the working gas and/or the reactive gas), an inflow of the process gas (for example the spatial distribution of the inflow), an inflow of the working gas (for example the spatial distribution of the inflow), an inflow of the reactive gas (for example the spatial distribution of the inflow), a transport speed of the substrate, an emission rate of the coating material. The electrical parameter may include, for example: an electrical power, an electrical current (flowing through the plasma, for example), an electrical voltage (applied across the plasma, for example).

For example, the controlled variable used in a coating process may be a parameter of the coating process or the result thereof that is established in reaction to the media supply. For example, for closed-loop control of the or each coating process, it is possible to use one or more than one of the following parameters of the coating process as controlled variable of the coating process: a pressure of the process gas (and/or the spatial distribution thereof), a partial pressure of the working gas (and/or the spatial distribution thereof); a partial pressure of one or more than one reactive gas (and/or the spatial distribution thereof), a property (e.g. chemical composition) of the reaction product, an electrical voltage (that drops across the plasma, for example), an electrical current (that is supplied to the plasma, for example).

Some parameters of the coating process may be used as a manipulated variable in some configurations and as a controlled variable in other configurations. For example, a voltage may be controlled according to the current or vice versa.

For example, each of the coating processes may be multistable (e.g. bistable). In other words, the or each coating process may have at least two stable setpoints (for example an oxidic setpoint and a metallic setpoint) and a transition region between the two stable setpoints. The closed-loop control 103 in that case may be effected, for example, by a balance control, for example by keeping each of the coating processes in an unstable reaction mode between the stable reaction modes.

Figure 2A:
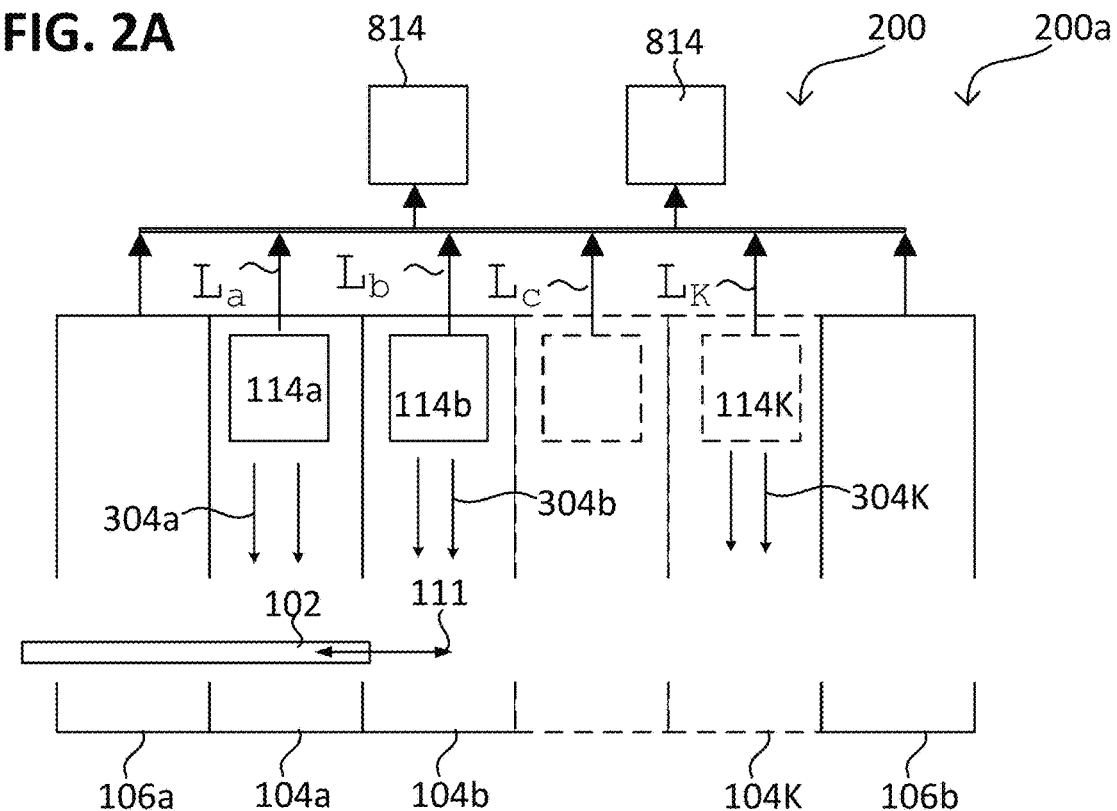
FIGS. 2A, 2B and 7 a process group in various aspects of the disclosure in various views.
Figure 2B:
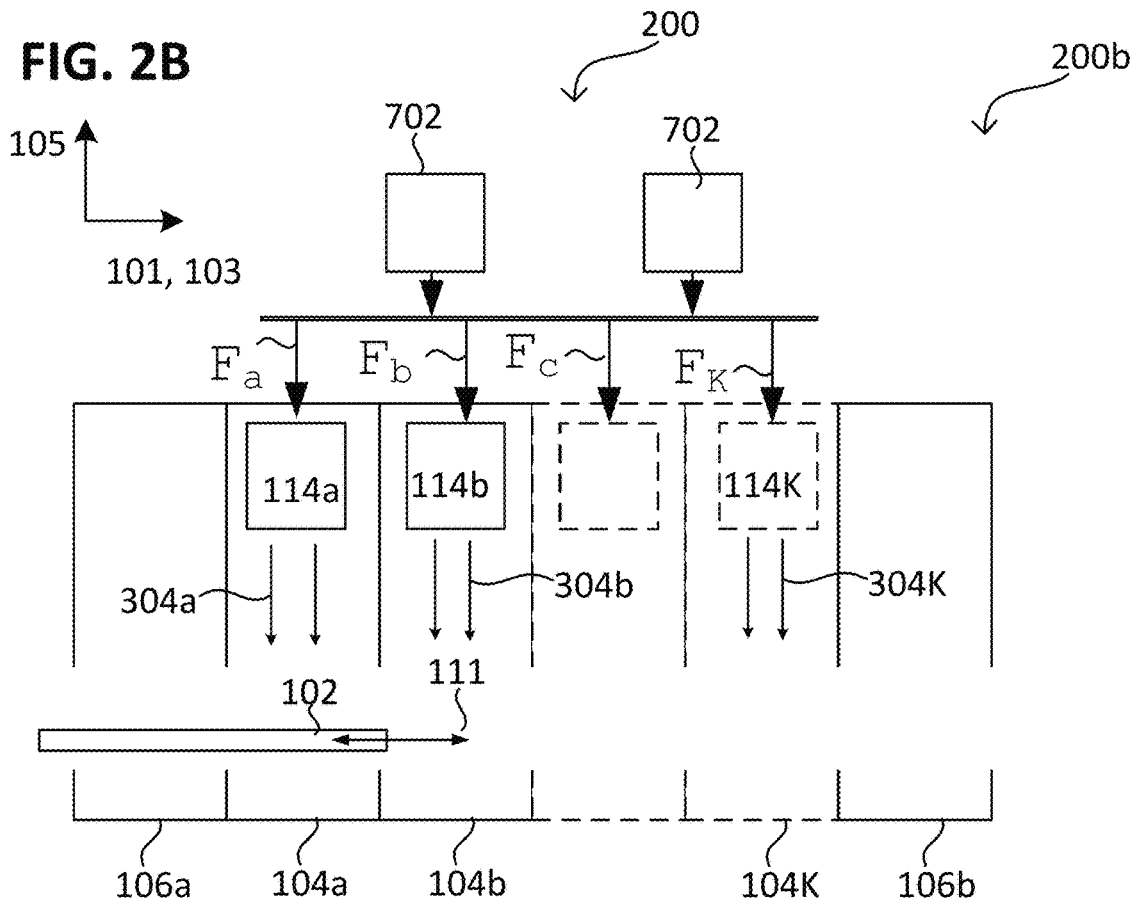

FIG. 2A and FIG. 2B each illustrate a process group 200 in various aspects of the disclosure in various construction diagrams 200a, 200b.

The process group 200 may perform multiple reactive coating processes, for example two or more reactive coating processes (e.g. three, four, five, six or more). For this purpose, the process group 200 may have multiple coating regions 104a, 104b, . . . , 104K, where exactly one coating process may be effected in each of the coating regions 104a, 104b, . . . , 104K.

Each of the coating regions 104a, 104b, . . . , 104K may have a corresponding coating apparatus 114a, 114b, . . . , 114K for performance of the respective coating process therein. Each of the coating regions 104a, 104b, . . . , 104K may have been provided or may be provided by means of a vacuum chamber (for example exactly one). One or more than one vacuum chamber may have been provided or may be provided by means of a chamber housing. Multiple vacuum chambers in a chamber housing may also be referred to as compartments. Each vacuum chamber may optionally have an opening closed by means of a chamber cover. Optionally, the coating apparatus may be secured on the chamber cover (also referred to collectively as process cover). The or each chamber housing may have, for example at the end face (for example at the inlet side and/or outlet side of each), a chamber flange by means of which two chamber housings may be connected to one another. The or each vacuum chamber in a chamber housing may be disposed between the two chamber flanges of the chamber housing.

The vacuum chambers may be separated from one another, for example by means of what are called chamber walls, such that these are partly (if only slightly) gas-separated from one another for vacuum purposes. However, the gas separation may be so minor that the multiple coating processes exchange a gas with one another (also referred to as gas exchange). For example, there may be a gas stream from a second coating region 104b through a first coating region 104a to a first pump region 106a.

In various aspects of the disclosure, the coating apparatus may be configured for coating of at least one substrate 102 (i.e. one or more than one substrate 102) which is transported 111, for example, through the respective coating region. For example, the coating apparatus may be configured to provide a gaseous coating material (material vapor) that may be deposited, for example, on the at least one substrate 102 to form a layer. A coating apparatus may include at least one of the following: a sputtering apparatus or a thermal evaporation apparatus (for example a laser jet evaporator, a light arc evaporator, an electron beam evaporator and/or a thermal evaporator). A sputtering apparatus may be configured to atomize the coating material by means of a plasma (also referred to as sputtering). A thermal evaporation apparatus may be configured to evaporate the coating material by means of thermal energy.

Each reactive coating process may be supplied with at least one reactive gas with which the emitted (for example atomized) coating material chemically reacts, such that the reaction product is deposited on the substrate 102.

The reactive gas may include a gaseous material that chemically reacts with the coating material and/or may be incorporated into the layer deposited by means of a chemical reaction. If, for example, a coating material that may form a nitride (e.g. AlNy) is used, or a nitride of the target material is to be deposited, the reactive gas may include or be formed from nitrogen. If, for example, a coating material that may form an oxide (e.g. AlOx) is used, or an oxide of the target material is to be deposited, the reactive gas may include or be formed from oxygen. The reactive gas may include or be formed from, for example, a gas mixture (reactive gas mixture) composed of multiple gaseous materials that react with the coating material and/or the layer deposited, for example oxygen and nitrogen, for example when an oxynitride (e.g. AlOxNy) is to be deposited. In various aspects of the disclosure, the reactive gas may include at least one of the following: hydrogen, water (gaseous, e.g. steam), oxygen, nitrogen, hydrogen sulfide, a hydrocarbon (e.g. methane), fluorine, chlorine, a nitrogen oxide (e.g. nitrogen monoxide or nitrogen dioxide).

Reference is made hereinafter, for simplified understanding, to sputtering as the coating process (also referred to as sputtering coating process). The descriptions may also apply analogously to another coating process, for example generally to a reactive physical vapor phase deposition (rPVD). The sputtering may be effected by means of a working gas (also referred to as plasma-forming gas) which is supplied to the sputtering coating process.

In various aspects of the disclosure, the working gas may include a gaseous material that is comparatively unreactive, i.e. is involved only in few chemical reactions. The working gas may be matched, for example, to the coating material used. For example, a working gas may include a gas or a gas mixture that barely reacts, if at all, with the coating material to yield a solid. For example, the coating material may be inert with respect to the working gas. The working gas may, for example, include a noble gas (e.g. helium, neon, argon, krypton, xenon, radon) or include multiple noble gases. The plasma may be formed from the working gas that essentially brings about the atomization of the magnetron cathode (also referred to as sputtering cathode) including the coating material.

The reactive gas has a higher chemical reactivity than the working gas, for example with respect to the coating material. The reactive gas and the working gas may be supplied collectively or separately as a process gas (for example as gas mixture), for example by means of a gas supply.

The coating material may be sputtered (atomized) by means of the working gas, and a chemical compound (the reaction product in other words) may be formed by means of a reactive gas supplied, for example a metal compound or a semimetal compound that may be deposited, for example, on a substrate 102. For example, the chemical compound may include or be formed from a metal oxide (e.g. AlOx) or semimetal oxide with oxygen as reactive gas, a metal nitride (e.g. AlNy) or semimetal nitride with nitrogen as a reactive gas, a metal oxynitride (e.g. AlOxNy) or semimetal oxynitride with oxygen and nitrogen as reactive gas or another metal compound or semimetal compound with another reactive gas (for example a metal carbide or semimetal carbide by means of a carbon-containing reactive gas). In other words, the layer material to be deposited (the reaction product in other words) may include a metal and/or a semimetal.

For example, more than one (for example each) coating process of the process group 200 may be supplied with the same working gas and/or reactive gas. Alternatively or additionally, more than one (for example each) coating process may use the same coating material.

The process group 200 may further include two pump regions 106a, 106b between which the multiple coating regions 104a, 104b, . . . , 104K are disposed. Gas may be withdrawn from each of the two pump regions 106a, 106b, for example more than one of the coating regions 104a, 104b, . . . , 104K. In various aspects of the disclosure, the process group 200 may have a pump arrangement 814 (including at least one high-vacuum pump). The pump arrangement 814 may be configured to withdraw a gas (for example the process gas depleted by reaction of reactive gas) at least from the two pump regions 106a, 106b and optionally at least one (for example each) coating region 104a, 104b, . . . , 104K, such that a vacuum (i.e. a pressure less than 0.3 bar) and/or a pressure within a range from about $10^{-3}$ millibar (mbar) to about $10^{-7}$ mbar (high vacuum in other words), or a pressure lower than high vacuum, for example lower than about $10^{-7}$ mbar (ultrahigh vacuum in other words), may have been provided or may be provided in each of the regions.

For withdrawal of gas from a coating region, the coating apparatus disposed therein and/or the chamber cover may have a pump connection (i.e. suction access) coupled to the pump arrangement 814. For example, the coating material of the sputtering coating apparatus may be disposed between the pump connection and the substrate 102 (or the transport pathway 111). The or each sputtering coating apparatus may have, for example, two magnetron cathodes between which the pump connection is disposed.

For example, each of the coating apparatuses 114a, 114b, . . . , 114K (e.g. magnetrons) may have or at least be secured to a chamber cover, where the chamber cover may have one or more than one pump connection through which the gas may be withdrawn from the corresponding coating process. It is then possible for one or more than one vacuum pump to be coupled to the chamber cover, for example exactly one vacuum pump per pump connection (for example what are called pumped magnetrons).

In addition, the process group 200 may be configured such that the vacuum conditions (the process conditions) within each of the multiple coating regions 104a, 104b, . . . , 104K (for example process pressure, process temperature, chemical composition of the process gas, etc.) may be set or controlled, for example during the performance of the coating process (for example according to the target setpoint).

In various aspects of the disclosure, the process group 200 may have a gas supply 702. By means of the gas supply 702, at least one (for example each) coating region 104a, 104b, . . . , 104K may be supplied with the process gas to form a process atmosphere in the regions. The process pressure may form from an equilibrium of process gas which is fed in by means of the gas supply 702 and is withdrawn by means of the pump arrangement 814.

In order to make the process group 200 as compact as possible, the coating regions 104a, 104b, . . . , 104K may adjoin one another or be provided without intervening pump regions 106a, 106b. The result of this may be that the coating regions 104a, 104b, 104K exchange more gas with one another.

For example, there may be less pumping output (or none at all) between two directly mutually adjacent coating regions than in each of the two directly mutually adjacent coating regions.

The layer deposited on the substrate 102 may thus have multiple sublayers, of which each sublayer is formed by means of one of the multiple coating processes 304a, 304b. For example, each of the sublayers may include the coating material and a constituent of the reactive gas, for example a reaction product thereof.

The process group 200 may be controlled, for example, by means of a group control device 228 as more specifically described hereinafter.

Figure 3A:
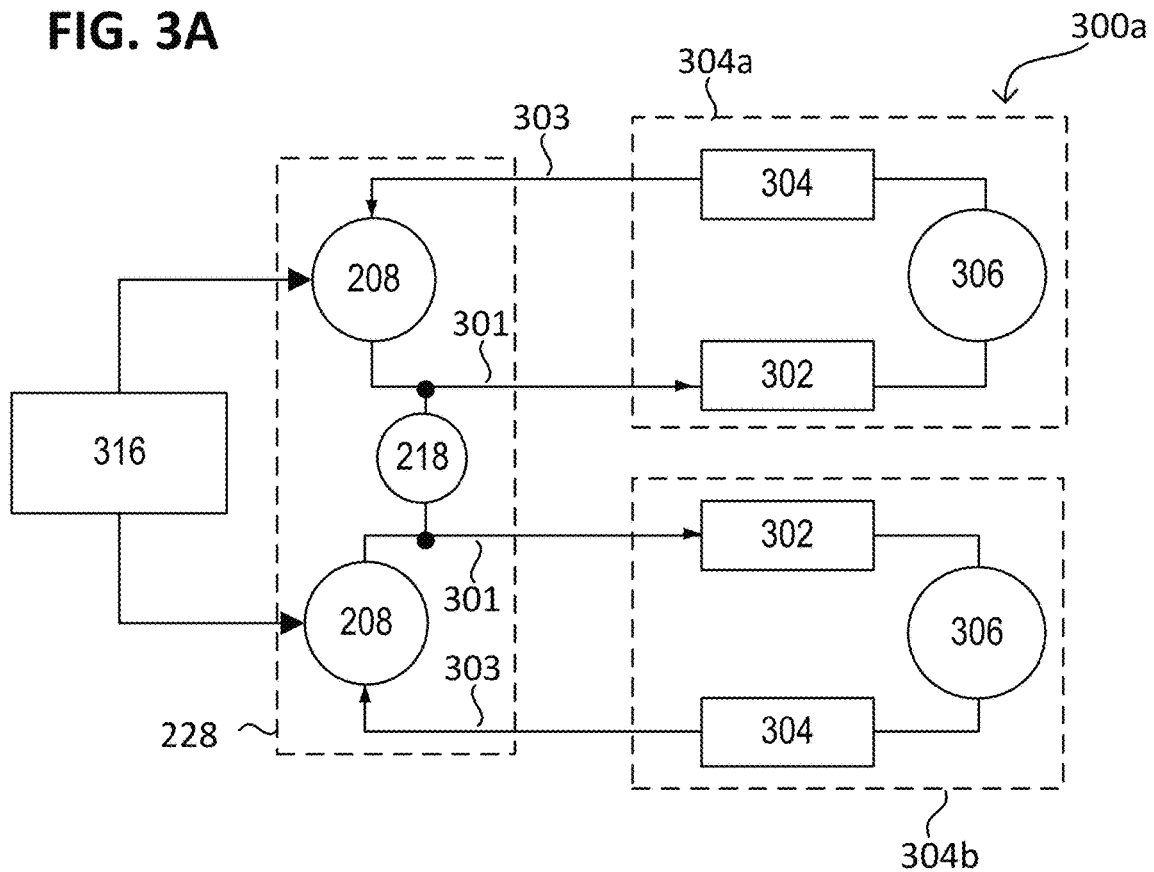
FIGS. 3A and 3B, 4A and 4B, 5A and 5B, and 6A and 6B the control of the method in various aspects of the disclosure in various diagrams.
Figure 3B:
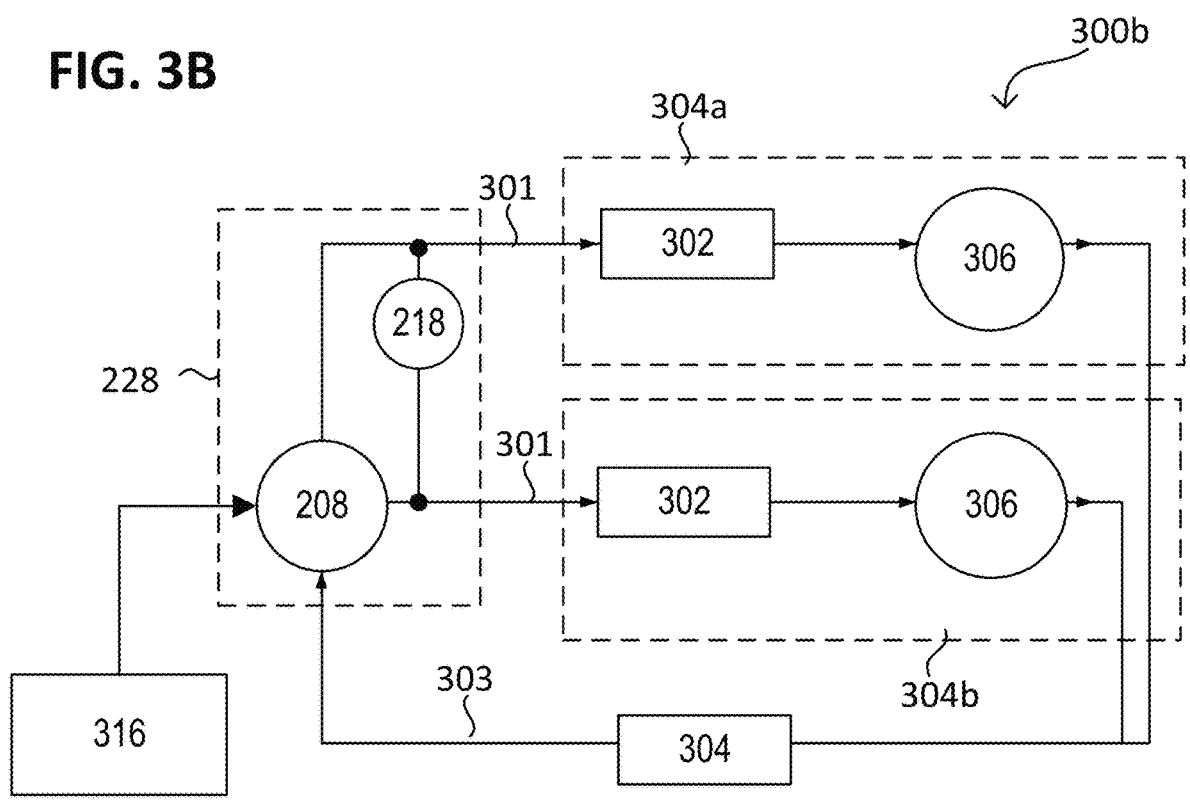

FIG. 3A and FIG. 3B each illustrate the closed-loop control 103 of the process group 200 in various aspects of the disclosure in various control diagrams 300a, 300b. The parameter 306 to be controlled by open-loop or closed-loop control (also referred to in simplified form as controlled variable) in a coating process may, for example, be a pressure and/or a gas composition used by the respective coating process, for example within one of the coating regions 104a, 104b.

In various aspects of the disclosure, a parameter may be understood to mean a physical parameter representing (for example describing and/or correlating with) a quantitatively detectable property of a physical entity (for example of an object, an operation or a state). Its state may optionally depend on time t and/or location, for example the composition and/or pressure of the process gas.

The controlled variable 306 may represent an actual state which is detected by a measuring element 304. The measuring element 304 may feed the detected actual state as first input parameter 303 (also referred to as feedback parameter 303) to a control device 208 (also referred to as feedback 303). More generally speaking, the feedback parameter 303 may also be a vector, according to the number of measurement data supplied. In addition, the control device 208 may be supplied with a target state 316 as a second input parameter (also referred to as specified parameter 316), for example a target pressure. More generally speaking, the specified parameter 316 may also be a vector, according to the number of parameters of the predefined state.

The control device 208 may compare the feedback parameter with the specified parameter 316 and control 301 (e.g., actuate) a control element 302 on the basis of a result of the comparison. The control element 302 (also referred to as control member or as actuator) may, for example, be the actuating drive of a valve of the gas supply 702 and/or of the pump arrangement 814 that conducts a standard volume flow including the reactive gas. The control element 302 may be controlled so as to minimize any variance of the target state from the actual state of the controlled variable 306 (also referred to as control deviation).

The manipulated variable refers to that variable which is varied in order to influence the controlled variable. The current value of the manipulated variable is the control value (for example the position of a valve).

In general, it is possible to use various manipulated variables in order to influence the same controlled variable. For example, it is possible to influence the pressure of a gas as controlled variable by varying the standard volume flow rate of gas which is supplied and/or withdrawn or by varying a temperature of the gas. The standard volume flow rate may be varied in turn by at least partly (i.e. partly or completely) opening or closing a valve. The gas may likewise be compressed and/or expanded in order to change its pressure. With regard to a valve, the manipulated variable may, for example, be the position of the actuating drive or a voltage and/or frequency supplied thereto. A further example of the manipulated variable is the opening state of a valve. In the case of a pneumatic actuating drive, for example, the pneumatic pressure on the actuating drive is used as manipulated variable.

For example, the process group 200 may have multiple control devices 208, of which each control device 208 is configured to control exactly one of the coating processes (also referred to as individual controllers 208), as illustrated in control diagram 300a.

The process group 200 may likewise have one or more than one control device 208, of which each control device 208 is configured to jointly control more than one of the coating processes (also referred to as group controller), as illustrated in control diagram 300b. For example, exactly one group controller 208 may control all coating processes of the process group 200.

The process group 200 may include the correction element 218 that relates a first manipulated variable $S_a$ of a first coating process 304a and a second manipulated variable $S_b$ of a second coating process 304b to one another. In general, by means of the correction element 218, multiple manipulated variables may be related to one another, of which each manipulated variable is assigned to exactly one of the multiple coating processes 304a, 304b. Each of the multiple manipulated variables may influence the same type of controlled variable, for example a pressure and/or a gas composition.

The relationship V of the multiple manipulated variables (also referred to as control relationship V) with one another by means of the correction element 218 may include correlation thereof with one another (for example dependently on one another and/or in parametrized form). The correction element 218 and the one or more than one control device 208 may together be or form part of the group control device 228. The correction element 218 may generally be part of a control device 208 or have been provided or be provided separately therefrom. The correction element 218 may, for example, have been implemented or be implemented by means of software, a database and/or a fixed connection.

The control relationship may, for example, include a mathematical relationship, for example a fixed ratio and/or a fixed separation of the control values of the multiple manipulated variables relative to one another. The control relationship may, for example, map the control values of the multiple manipulated variables on one another or map a common reference parameter onto the control values of the multiple manipulated variables (also referred to as parametrization).

For example, for the multiple coating processes 304a, 304b, it is possible to provide a common instantaneous setpoint (also referred to as group actual setpoint LAG), from which, according to the control relationship, the individual control values to be established are determined. Alternatively or additionally, the same may apply in analogy to a group target setpoint SAG. For example, the control values to be established may be parametrized by means of the group actual setpoint LAG and/or the group target setpoint SAG. Optionally, the group actual setpoint may be provided on the basis of the actual setpoint 306 of one or more than one coating process of the multiple coating processes 304a, 304b.

The control relationship simplifies the complexity of the closed-loop control of the multiple coating processes 304a, 304b. Illustratively, the control relationship counteracts the decoupling of the multiple coating processes 304a, 304b from one another. With knowledge of the control relationship, there is fusion of the control circuits of the multiple coating processes 304a, 304b in terms of control technology to give a common control circuit. For example, the multiple coating processes 304a, 304b may be controlled on the basis of exactly one measuring element 304. The measuring element 304 may, for example, detect the actual state of the controlled variable 306 of exactly one or more than one coating process 304a, 304b. However, it is also possible to use multiple measuring elements 304, as described more specifically later on.

The controlled variable of a coating process may generally represent the setpoint of the coating process, for example the pressure of the reactive gas. The manipulated variable may represent, for example, a reactive gas flow rate supplied to and/or withdrawn (e.g., removed) from the coating process.

Figure 4A:
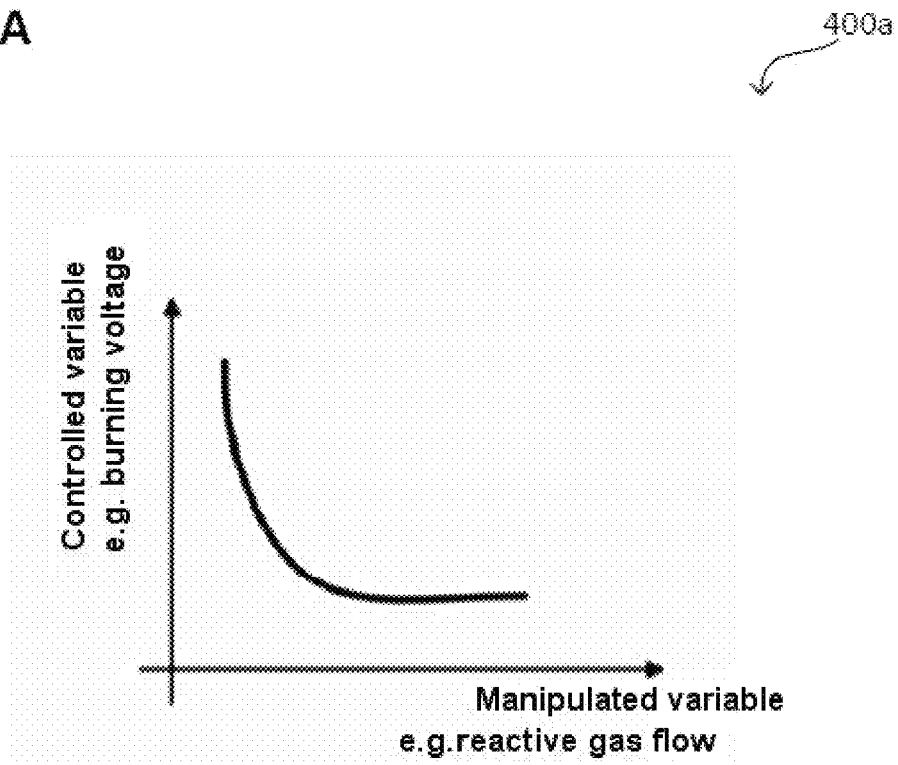
Figure 4B:
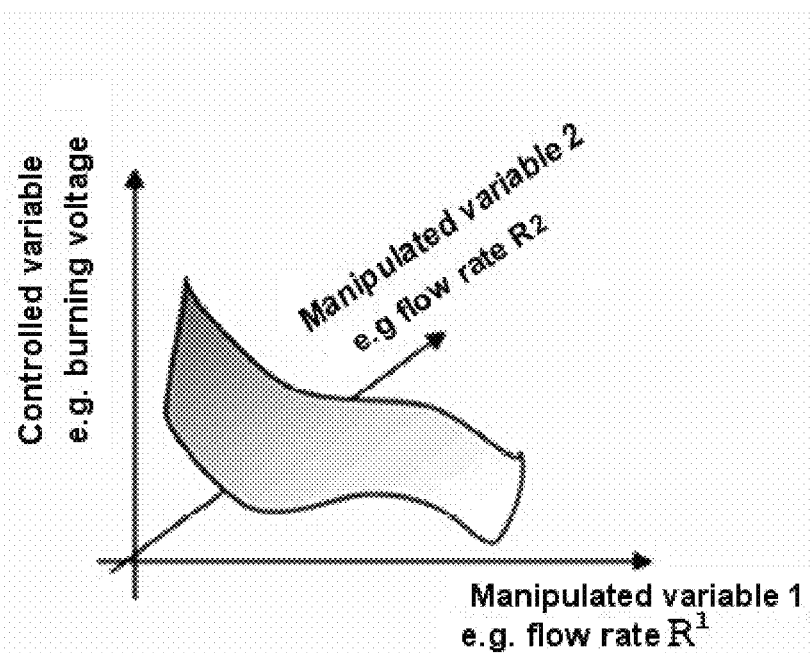

FIG. 4A and FIG. 4B respectively illustrate the closed-loop control 103 of the process group 200 in various aspects of the disclosure in various diagrams 400a, 400b.

The process group 200 (also called deposition zone) may use multiple process components configured in the same way (for example coating apparatuses) and identical coating materials to deposit a layer on the substrate 102. In the process group 200, the individual process components (for example magnetrons) form a common group. Individual controlling of the process components is no longer possible directly since the process gases that are supplied to the corresponding process components affect the setpoint of the whole group.

For example, the coating material may include or be formed from a conductive metal or semimetal or an alloy thereof. The coating material may optionally include a metal or semimetal doped by another chemical element, for example in order to improve the conductivity of the coating material. In a reactive magnetron sputtering coating process, the coating material and one or more than one suitable reactive gas may be used to deposit a chemical compound (also referred to as reaction product) on the substrate. In the simplest case, a coating material consisting of a single chemical element M may be reacted with a single reactive gas R (which is admitted into the respective coating region) to deposit the reaction product $M_xR_y$ (for example with $x \neq 0$ and $y \neq 0$).

The rate (i.e. amount per unit time) of reactive gas supplied and/or coating material atomized may be controlled according to the corresponding chemical valency and/or stoichiometry of the reaction product $M_xR_y$. For example, silicon having the +IV valency and nitrogen having the –III valency combine to form $Si_3N_4$. The rate at which a gas is supplied and/or withdrawn (i.e. the flow rate thereof) may be reported, for example, as the standard volume flow rate. Hereinafter, for simple understanding, reference may be made to a stoichiometry of x=y=1 and to the standard volume flow rate. However, what has been described may also be applicable to a different stoichiometry, e.g. $x \neq y$, or a different rate or parameter.

For example, the reaction product $M_xR_y$ by means of which the layer is formed may include or be formed from an oxide or nitride. For this purpose, for example, sputtering may be effected under oxygen or nitrogen as reactive gas.

In general, it is also possible to supply multiple different reactive gases $R^1$ and $R^2$ to a coating process, for example as a gas mixture. In other words, the process gas may include multiple different reactive gases. This may enable adjustment of the coating process and/or adjustment of the material properties of the layer deposited on the substrate. For example, a barrier layer may be produced by means of a reactive gas mixture. In that case, the reaction product $MR^1R^2$ may be deposited.

The stoichiometric composition and hence the layer properties of the reaction product or of the layer $MR^1R^2$ to be formed may depend on a multitude of factors, for example
- on the chemical reactivity of the starting compounds;
- on the reactive gas mixing ratio $R^1:R^2$;
- on the other parameters of the setpoint of the coating process (also referred to as process conditions).

A variation in the process conditions for formation of a reaction product $MR^1R^2$ thus results in a change in the layer properties, for example the layer thickness and/or the refractive index of the layer. The process conditions may be varied deliberately (also referred to as controlling), for example in such a way that specific layer properties may be established. The process conditions may be varied inadvertently, such that drifting and other perturbation events (more generally also referred to as disturbance parameter or disturbance) worsen the target result.

A control device or a closed-loop control circuit provided by means thereof may counteract the effect of the disturbance parameter, for example automatically compensate for the influence thereof. This enables more stable and target-oriented running of the coating process.

For multiple coating processes separated from one another (also referred to as individual processes) that have, for example, complete gas separation from one another, it is also possible to use mutually separated closed-loop control circuits. Such a case of lesser complexity is illustrated, for example, in diagram 400a.

In the case of process group 200, however, complexity is increased since multiple process components act together as a group (deposition zone), and the manipulated variable of the closed-loop control circuit of the reactive gas may be multidimensional. Such a case of lesser complexity is illustrated, for example, in diagram 400b. In such a two-dimensional closed-loop control circuit, the correlation between controlled variable and manipulated variable may be more complicated since a multitude of combinations of manipulated variable 1 ($S_a^1$) and manipulated variable 2 ($S_a^2$) result in the same state of the controlled variable. In other words, the current setpoint (also referred to as instantaneous setpoint) may be discernible only with difficulty.

If there is a further additional controlled variable, the closed-loop control circuit may no longer easily be represented in graph form. By means of what is called a multivariate covariance analysis (ANCOVA), it is possible, for example, on the basis of experimental data, to determine a mathematical model that may predict the behavior of the overall system to be controlled.

Figure 5A:
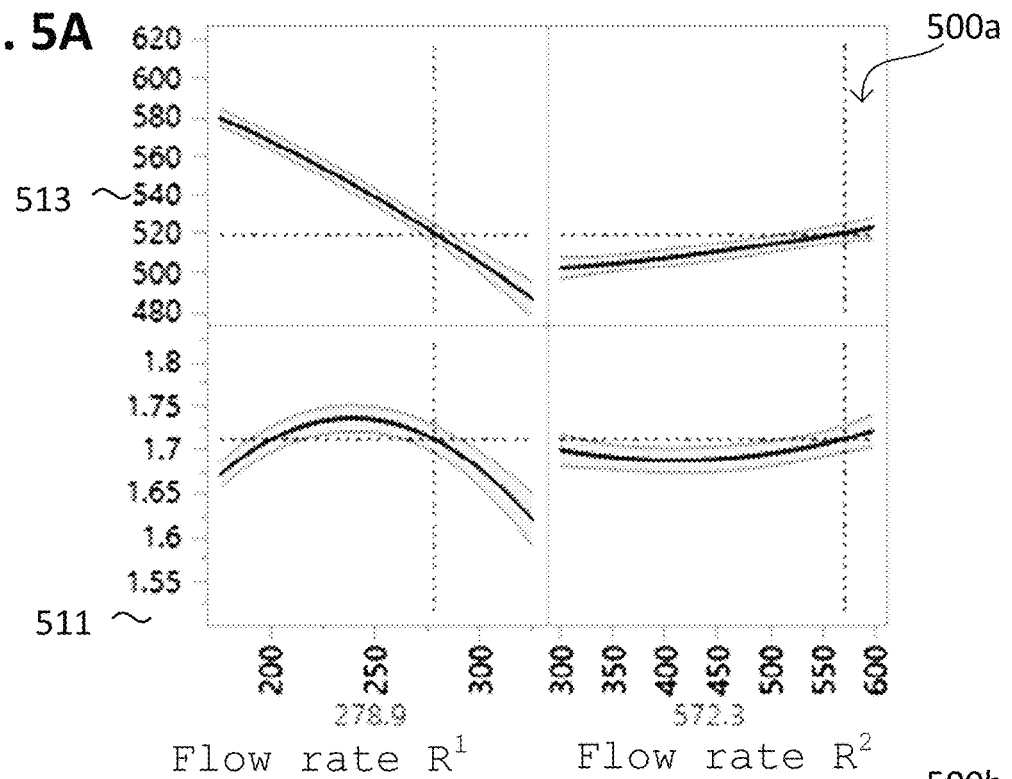
Figure 5B:
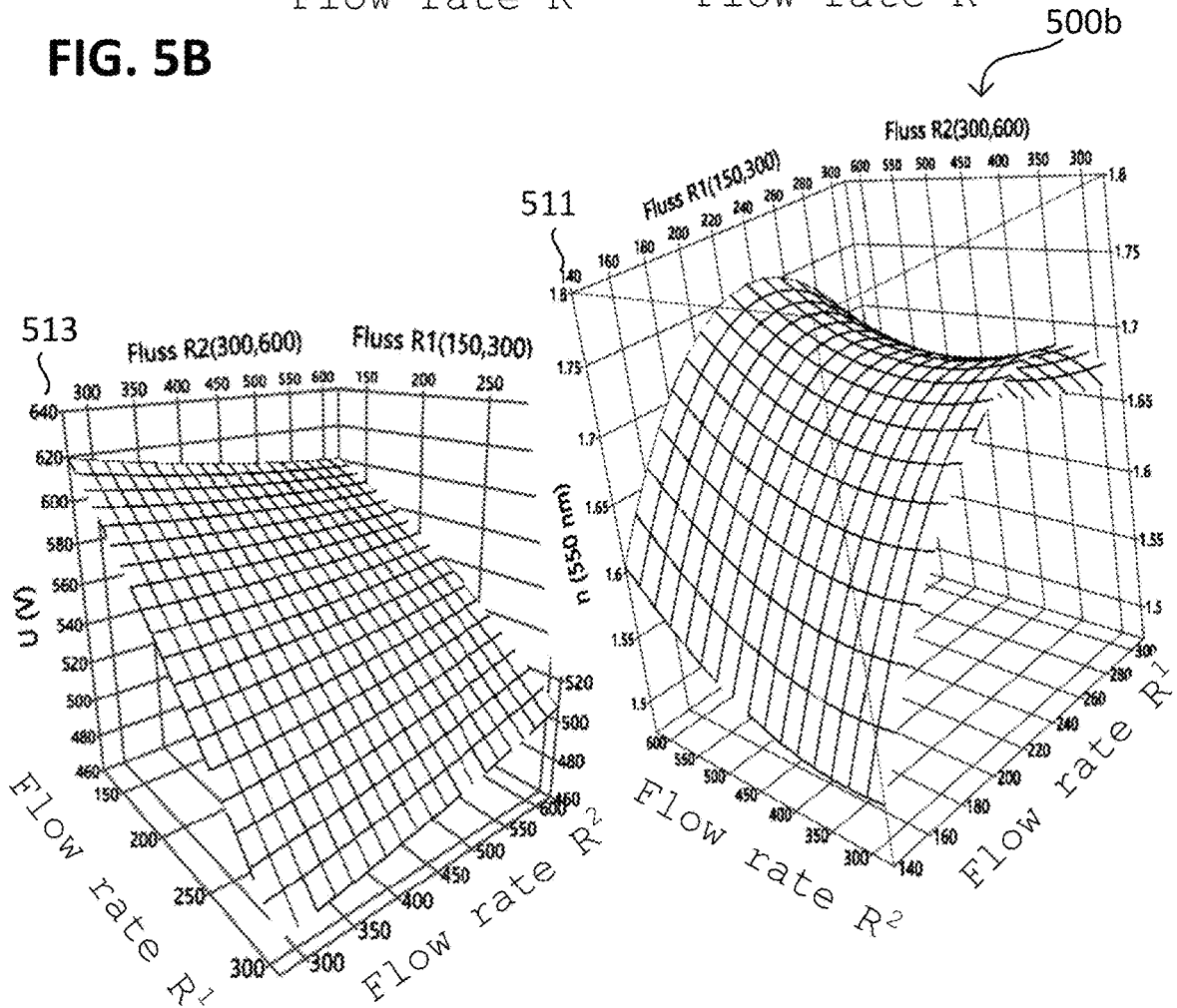

FIG. 5A and FIG. 5B each illustrate the closed-loop control 103 of the kth coating process of process group 200 in various aspects of the disclosure in various diagrams 500a, 500b, in which the parameter space of the kth coating process is represented in two manipulated variables and two controlled variables (for example an electrical voltage 513 and the refractive index 511 of the layer of $MR^1R^2$). Diagram 500a illustrates sections of the diagrams 500b. The voltage 513 may, for example, be the voltage 513 dropped across the coating apparatus and/or across the plasma (also referred to as burning voltage 513). What has been described for the voltage 513 may be correspondingly applicable to an electrical parameter that represents the electrical power supplied to a coating apparatus (also referred to as generator power).

In such a complex closed-loop control circuit, there frequently exist sets of curves, surfaces or hypersurfaces that represent a solution to the overall system. If the kth coating process to be controlled has too many degrees of freedom, automatism may lead to an "unhappy" solution.

The complexity may be simplified by setting up one or more than one degree of freedom of the kth coating process as being invariant. In the example illustrated in diagrams 500a, 500b, the influence of the gas flow of a first reactive gas $R^1$ on the voltage 513 as controlled variable is much stronger than the gas flow of a second reactive gas $R^2$. It is therefore possible to control the voltage 513 as a controlled variable by means of the gas flow (for example standard volume flow rate) of the first reactive gas $R^1$ as manipulated variable, where the ratio of the gas flow of $R^1:R^2$ remains constant.

In the example illustrated in diagrams 500a, 500b, the refractive index 511 as additional controlled variable is less sensitive to variation of the manipulated variable of the gas flow of the second reactive gas $R^2$. In addition, the refractive index 511 may be controlled by means of a smaller so-called P element (also referred to as proportional element) (i.e. more gradually) than the voltage 513, for example when the refractive index 511 is determined with a time delay (for example only after the complete layer has been formed).

The time delay between the attainment of an actual state of a controlled variable and the detection thereof is also called dead time $\Delta t$. More generally speaking, the dead time $\Delta t$ separates the juncture at which the system adopts an actual state and the juncture at which the actual state detected is fed back 303, for example sent to the control device 208.

In various aspects of the disclosure, such a closed-loop control circuit that controls multiple controlled variables (with different dead times $\Delta t$) in the coating process by means of multiple manipulated variables of the coating process may be cascaded for each coating process. For example, a primary controlled variable may have a shorter dead time $\Delta t$ than a secondary controlled variable of the coating process.

The cascaded closed-loop control circuit may have a first control element (also referred to descriptively as high-speed control element) that controls the primary controlled variable $P_a^1$ by means of that manipulated variable $F_a^1$ which has the greatest influence (also referred to as leverage) on the primary controlled variable, i.e. $\delta P_a^1/\delta F_a^1 > \delta P_a^1/\delta F_a^x$ (with $x \neq 1$). One or more than one additional manipulated variable Fax with smaller leverage than the manipulated variable (i.e. $\delta Pa^1/\delta F_a^1 > \delta P_a^1/\delta F_a^x$) may be kept constant within the time window of the high-speed control element (i.e. be invariant with respect to the control of the controlled variable).

The cascaded closed-loop control circuit may also have a second control element (also referred to descriptively as a low-speed control element) that controls at least a secondary controlled variable $P_a^2$ by means of that additional manipulated variable $F_a^2$ which has the greatest influence on the secondary controlled variable $P_a^2$, i.e. $\delta P_a^2/\delta F_a^2 > \delta P_a^2/\delta F_a^x$ (with $x \neq 2$).

While the high-speed control circuit keeps the setpoint of the coating process constant, the at least one (descriptively slower) secondary controlled variable, the feedback 303 of which has a time delay, is under slower closed-loop control.

The low-speed control element may control, for example, the refractive index 511 of the layer. This can be detected by means of an optical measurement. The dead time $\Delta t$ of the refractive index 511 may, for example, be several orders of magnitude greater than that of the primary controlled variable. Alternatively or additionally, the dead time $\Delta t$ of the voltage U may be less than 100 ms (milliseconds) and the dead time Δt of the second controlled variable may be greater than 30 s (seconds).

The manipulated variable that is tracked by the low-speed control element may, for example, be defined, according to the data position. In the example illustrated in diagrams 500a, 500b, for example, the target state of the high-speed control element may be tracked, or the gas flow ratio of the reactive gases $R^1$ and $R^2$.

Other examples of controlled variables with long dead time Δt or low-speed control elements may include:
the layer thickness as slow controlled variables, which may be determined, for example, by means of the optical measurement of the layer alternatively or additionally to the refractive index 511;
a low-speed third control element may set, for example, a slow controlled variable. For example, the layer thickness as controlled variable which is detected by means of the optical measurement may be controlled by a generator power as manipulated variable.
a fourth control element may optionally provide additional information as to the layer thickness distribution transverse to the transport direction from lateral information (for example multiple traces from inline or an ex-situ traverse measurement). The manipulated variable of such lateral information as input signal from the fourth control element may include, for example: the trim gas channels of a sputtering cathode and/or the adjustable magnetic field of a sputtering coating apparatus.

Figure 6A:
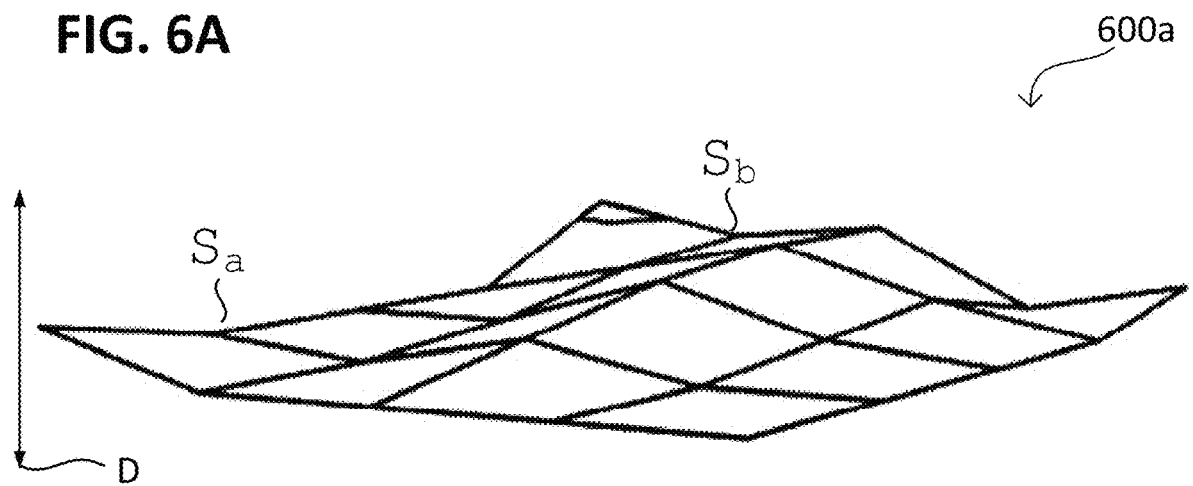
Figure 6B:
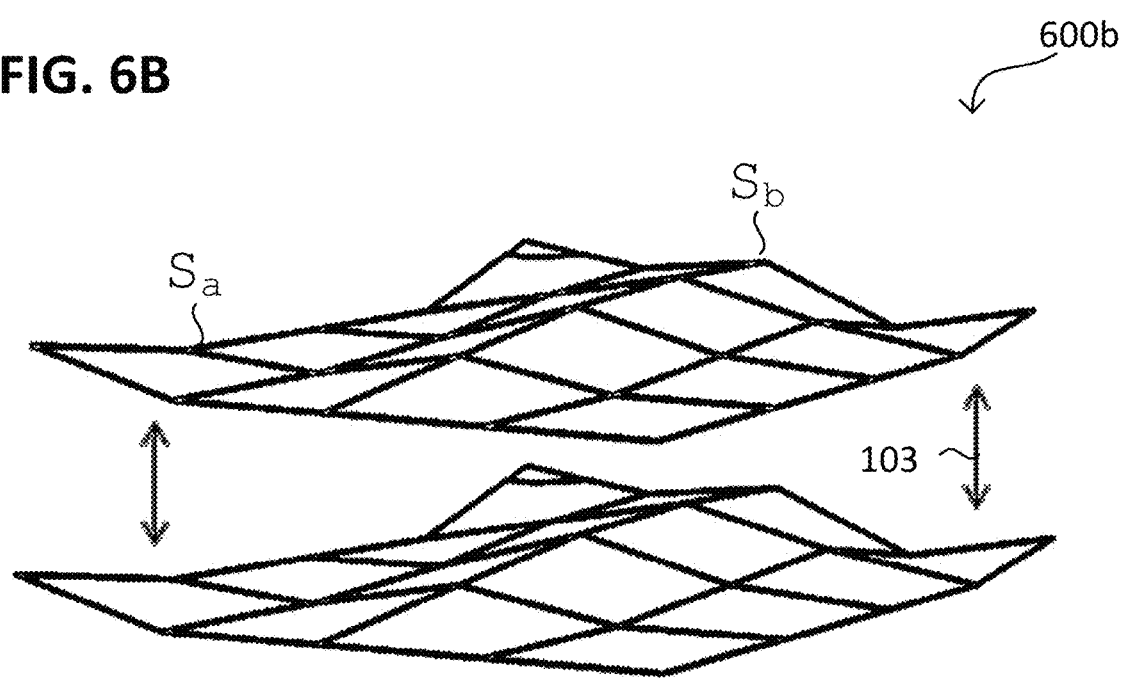

FIG. 6A and FIG. 6B each illustrate the closed-loop control 103 of the process group 200 in various aspects of the disclosure in various diagrams 600a, 600b.

Process group 200 may have multiple (e.g. n) identical process covers, of which each process cover may have one coating apparatus and/or each may have the same coating material. Each coating process may be performed, for example, by exactly one process cover. This achieves deposition of a combined layer with high productivity.

In the ideal case, the coating processes 304a, 304b of process group 200 would have such similarity that their coating components may be controlled by means of identical control values. In a real process group 200, the current configuration thereof (for example a construction variation of the process covers) and/or an interaction (for example a gas exchange) between the coating processes 304a, 304b may act as disturbance variable. If each process cover were to be controlled individually with a dedicated closed-loop control circuit, the coating processes 304a, 304b may diverge. For example, a first coating process 304a may drift into a gas excess, while a second coating process immediately adjacent thereto drifts into a gas deficit. The dedicated closed-loop control circuits may not immediately recognize and/or inhibit such a drift. For example, the gas exchange may mutually compensate for the gas excess and the gas deficit, such that the dedicated closed-loop control circuits do not recognize the drift.

In various aspects of the disclosure, the correction element 218 may be configured to limit an interval D in which the control value of each of the dedicated closed-loop control circuits may lie (cf. diagram 600a). Such a control relationship may, for example, satisfy the relation $(S_a+S_b)/2 \in D$, where $S_a$ is the control value of the first coating process 304a and $S_b$ is the control value of the second coating process 304b.

Alternatively or additionally, the differential D between the control values $S_a$, $S_b$ of the multiple coating processes 304a, 304b may be limited at the upper end. Such a control relationship may, for example, satisfy the relation $S_a - S_b \leq D$, where $S_a$ is the control value of the first coating process 304a and $S_b$ is the control value of the second coating process 304b. The actual value of the differential D may be input into the correction element 218, for example by means of a user interface.

However, the complexity of such a closed-loop control circuit may still be very high. For example, it may be necessary for the operator of the process group 200, given n process covers or coating processes and m manipulated variables, to monitor a total of 2·m·n limits for the control values. Given 10 magnetrons and two gas flows per coating process as manipulated variable, the result would thus be 40 limits that would have to be monitored individually. Moreover, the individual controllers may be costly and/or more complex than a group controller. The individual controllers could be synchronized by means of the correction element alternatively or additionally to the limitation of the manipulated variable, but this may be technically complex.

In various aspects of the disclosure, it has been recognized that the closed-loop control circuit of the process group 200 may be simplified further, for example in that the closed-loop control circuit is based only on the following parameters: the total pressure, the gas flow of the first reactive gas $R^1$, the gas flow of the second reactive gas $R^2$, the generator output, the burning voltage. All other parameters of the setpoint of the process group or coating components thereof may initially be parametrized and the parametrization thereof may be implemented by means of the correction element 218 (for example in a correlation matrix), as described more specifically hereinafter. For example, the relationship may include a parametrization of the manipulated variables of the multiple coating processes 304a, 304b.

For simplified understanding, reference is made hereinafter to parametrization by means of a correlation matrix. However, what is described may also apply to another type of parametrization.

A correlation matrix for the process group 200 may be formed, for example, by means of a multivariate covariance analysis (ANCOVA). The size and dimensions of the correlation matrix, which may generally be a tensor but is also referred to hereinafter simply as matrix, may depend on a result of an interaction analysis of the coating process or of the corresponding coating components.

It is optionally possible to use multiple separate correlation matrices for a process group, or these are combined in a higher-order tensor. The first vector of a correlation matrix may reference the individual coating process or the corresponding coating components. In the case of a highly pronounced interaction of the controlled variables with one another, it is also possible to use a higher-order tensor in which each further vector references an interacting controlled variable. The correction element 218 provided in this way may, together with the one or more than one control device 208 of the process group, implement a group controller that controls a group manipulated variable that is to be selected to a group target state of the controlled variable that is to be defined. The individual coating processes or the corresponding coating components of the process group 200 may be made dependent on one another according to the correlation matrix. One example of such a control relationship is illustrated, for example, in diagram 600b.

The closed-loop control may include, for example, varying the control values $S_a$, $S_b$ of the multiple coating processes 304a, 304b in such a way that their difference D remains constant in relative terms (i.e. is invariant with respect to the closed-loop control 103). Such a control relationship may, for example, satisfy the relation $S_a-S_b=D$, where $S_a$ is the control value of the first coating process 304a and $S_b$ the control value of the second coating process 304b.

The correlation matrix may be determined and/or updated during the startup and/or a process optimization. The closed-loop control 103 may be effected by means of a programmable logic controller (PLC) in which the correlation matrix as correction element 218 may be stored in the form of a field variable. By means of a user interface, the correlation matrix or the field variable may be varied by the operator of the process group 200, such that the variation thereof is stored in the PLC. The user interface may provide, for example, a variable assignment of the individual coating processes to the process group, for example by means of a checkbox. If a coating process is removed from the process group 200, the components of the correlation matrix that were assigned to the coating process removed are set to zero. There follows a more detailed description of the determining of the correlation matrix of the control relationship. As mentioned above, the control relationship may be determined by means of an ANCOVA. Alternatively or additionally, it is also possible to use other methods for determining the control relationship, for example fuzzy logic or an artificial neural network (ANN). An ANN may be trained by conventional training methods, for example what is called the back propagation method or the deep learning method. In the training, the training vectors are determined according to the input parameters desired in each case (for example standard volume flow rate, pressure, suction output, partial pressure, etc.).

Figure 7:
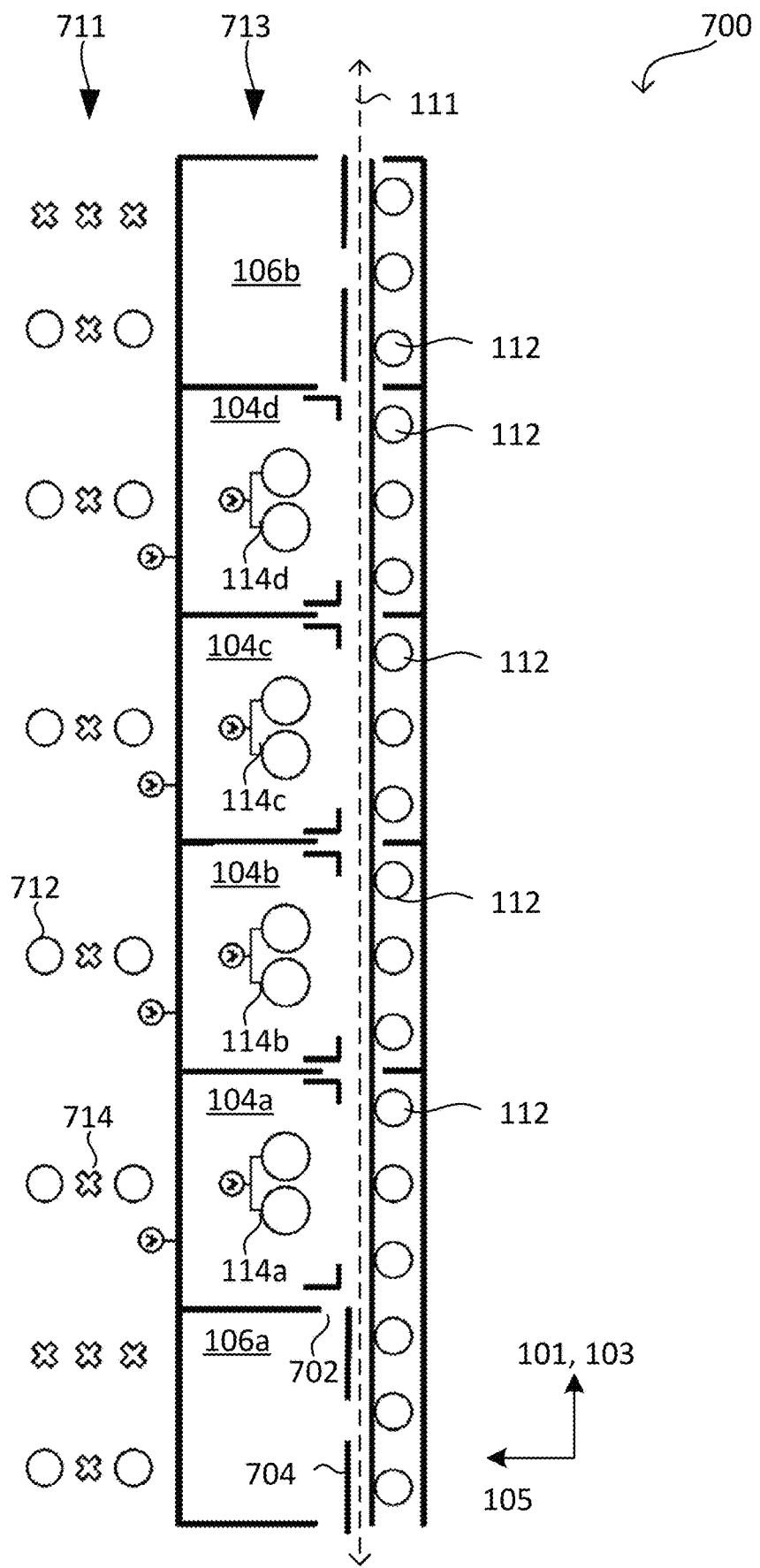

FIG. 7 illustrates a process group 700 in various aspects of the disclosure in a cross-sectional view 713 and a top view 711 of the process cover, for example configured like the process group 200. The process group 700 has four coating regions 104a to 104d disposed along a transport pathway 111 between two pump regions 106a, 106b. The transport pathway 111 may be provided by means of a transport apparatus having multiple transport rolls 112 in each of the coating regions 104a to 104d. Directly mutually adjacent regions (e.g. coating regions 104a to 104d or pump regions 106a, 106b) may be connected to one another in a gas-conducting manner by means of what is called a substrate transfer opening 702, such that gas is exchanged between these. Each of the sputtering coating apparatuses 114a to 114b may have two magnetron cathodes, for example. Each of the two pump regions 106a, 106b may be free of any coating apparatus and/or have a cover plate 704 that separates the pump connection from the transport pathway 111. 711 illustrates the process covers of the process group 700, wherein the pump connections 714 having a dead-end closure are represented by means of a cross, and the pump connections 712 coupled to the pump arrangement 814 are represented by means of a circle.

Figure 8:
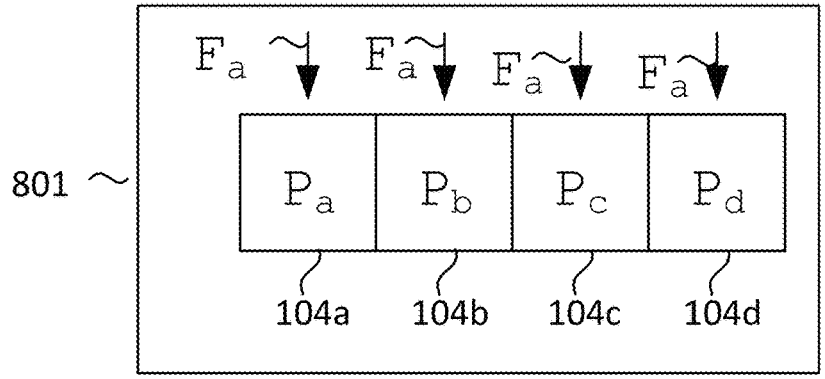
Figure 8:
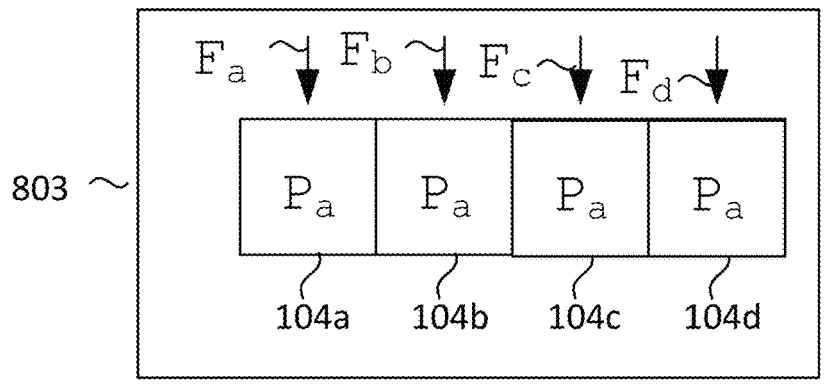
Figure 8:
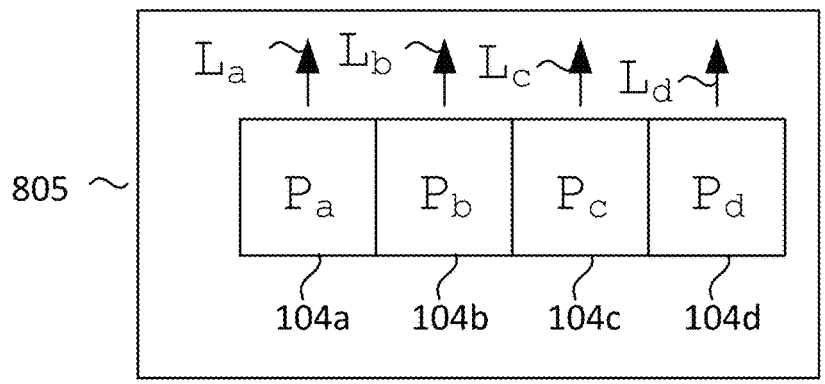
Figure 8:
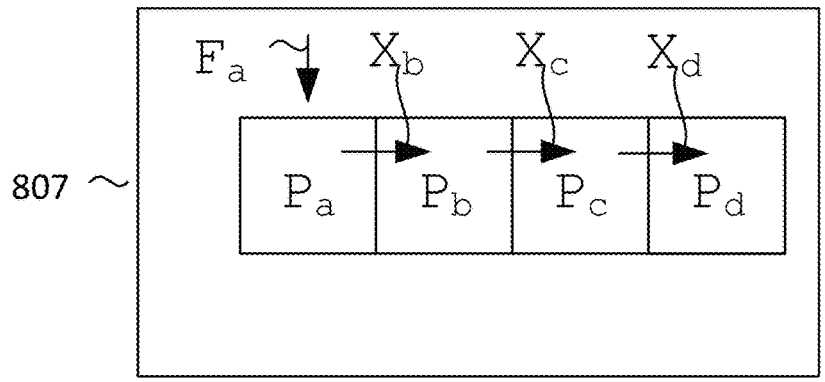

FIG. 8 illustrates a method 800 of calibrating the process group 700 in a schematic flow diagram. Hereinafter, for simple understanding, reference is made to the pressure P as controlled variable, the standard volume flow rate F as manipulated variable, and the gas exchange as interaction. What has been described may also apply in analogy to another controlled variable, another manipulated variable, another interaction, multiple controlled variables per coating process, multiple interactions per coating process and/or multiple manipulated variables per coating process. The standard volume flow rate F may, for example, specify the gas rate (e.g. inert gas, e.g. argon) into one of the coating regions.

In the method 800, the pump arrangement 814 may be moved to the setpoint that it also adopts during the performance of the coating processes 304a, 304b. However, the coating apparatuses need not necessarily be in operation.

The method 800 may include: determining an actual pressure $P_a$ of a first coating region 104a when a second standard volume flow rate is being supplied to and/or withdrawn (e.g., removed) from the second coating region 104b; and determining an actual pressure $P_b$ of a second coating region 104b when a first standard volume flow rate is being supplied to and/or withdrawn from the first coating region 104a. In a similar manner, the exchange of gas between the more than two coating regions 104c, 104d may be determined, for example by means of the actual pressure $P_c$, $P_d$ established at a standard volume flow rate.

For example, in configuration 801, each of the coating regions 104a to 104d may be supplied with the same standard volume flow rate $F_a$, and the resultant pressure may be detected in each of the coating regions 104a to 104d. Owing to the exchange of gas between the coating regions 104a to 104d and with the pump regions 106a, 106b, the actual pressures may be different from one another, with the difference in each case representing the exchange of gas.

Alternatively or additionally, in configuration 803, each of the coating regions 104a to 104d may be supplied with such a standard volume flow rate that the resultant pressure in each of the coating regions 104a to 104d is identical. Owing to the exchange of gas between the coating regions 104a to 104d and with the pump regions 106a, 106b, the actual standard volume flow rates $F_a$ to $F_b$ may differ from one another (for example at least in pairs), with the difference in each case representing the exchange of gas.

Alternatively or additionally, in configuration 805, an effective suction output L (also referred to as actual suction output) may be determined for each of the coating regions 104a to 104d. The actual suction output may represent which standard volume flow rate is taken from the corresponding coating region. A first suction output $L_a$ applied to the first coating region 104a may be determined, for example, on the basis of the first standard volume flow rate $F_a$ and the resultant first actual pressure $P_a$. The suction output of the other coating regions 104b to 104d may be determined in an analogous manner, for example in configuration 801 or configuration 803. The suction output may be determined, for example, on the basis of the quotient of the standard volume flow rate and the pressure. Owing to the exchange of gas between the coating regions 104a to 104d and with the pump regions 106a, 106b, the actual suction outputs $L_a$ to $L_d$ may differ from one another, with the difference in each case representing the exchange of gas.

Alternatively or additionally, in configuration 807, an effective gas exchange X (also referred to as actual gas exchange) may be determined for each of the coating regions 104a to 104d. The actual gas exchange X may represent which standard volume flow rate is fed to the corresponding coating region from another coating region. A second actual gas exchange $X_b$ which is fed to the second coating region 104b from the first coating region 104a may be determined, for example, by supplying solely the first coating region 104a with the standard volume flow rate $F_a$ and determining the resultant second actual pressure $P_b$. The actual gas exchange of the kth coating region (k=1, 2, 3 or 4) may satisfy the following relation, for example: $X_n=P_n \cdot L_n-F_a$. The values for $L_n$ may be determined, for example, according to 805. The actual gas exchange X of the third and fourth coating regions 104c, 104d may be determined in an analogous manner. By means of the relation for $X_n$, it is also possible to determine a first actual gas exchange $X_a$ of the first coating region 104a which, illustratively, takes into account the resistance to the gas flow flowing out of the first coating region 104a. Owing to the exchange of gas between the coating regions 104a to 104d and with the pump regions 106a, 106b, the actual gas exchanges $X_a$ to $X_d$ may differ from one another, with the difference in each case representing the exchange of gas. The actual gas exchange may be determined in an analogous manner if only the second coating region 104b, only the third coating region 104c or only the fourth coating region 104d is supplied with gas. The respective coating region supplied with gas is also referred to as swelling region.

Two or more of the parameters determined in one or more than one of the configurations 801, 803, 805, 807 (also as gas exchange parameters, for example actual standard volume flow rates, actual suction outputs, actual gas exchanges, and/or actual pressures) that represent the gas exchange may be used individually and/or combined with one another, as described more specifically hereinafter.

The difference in the gas exchange parameters may optionally be minimized in one or more than one of the configurations 801, 803, 805, 807 (for example iteratively or by means of a variation calculation). This optimizes the process outcome of the process group 700.

FIG. 9 illustrates multiple correlation matrices 901a, 901b, 901c, 901d for calibration of the process group 700 in a schematic tabular overview 900, of which each correlation matrix references, in a first dimension 91, the multiple coating regions or coating processes 304a, 304b performed therein and, in a second dimension 95, the gas exchange parameters. Illustratively, a correction element may be formed on the basis of the gas exchange parameters determined in 800, wherein the correction element may include at least one (i.e. one or more than one or each) of the correlation matrices 901a, 901b, 901c, 901d. For example, k=a may be assigned to the first coating process 304a, k=b to the second coating process 304b, k=c to the third coating process 304c, and k=d to the fourth coating process 304d. The exchange factor $Y_k$ may be the normalized actual gas exchange $X_k/X_a$ for 901a, $X_k/X_b$ for 901b, $X_k/X_c$ for 901c and $X_k/X_d$ for 901d.

The correlation matrices 901a, 901b, 901c, 901d may also be collated as a higher-order tensor 900, which in that case references the swelling region, for example, in a third dimension. But it is also possible to use a simpler correlation matrix, as described hereinafter.

FIG. 10 illustrates multiple correlation matrices 1001a, 1001b for calibration of the process group 700 in a schematic tabular view 1000, of which each correlation matrix references, in a first dimension 91, the multiple coating regions or coating processes 304a, 304b performed therein and, in a third dimension 93, the swelling region. Illustratively, a correction element may be formed on the basis of the gas exchange parameters determined in 800, wherein the correction element may include at least one (i.e. one or more than one or each) of the correlation matrices 1001a, 1001b. A first correlation matrix 1001a (also referred to as exchange matrix) may specify, for example, the exchange factors $Y_k$. A second correlation matrix 1001b (also referred to as suction matrix) may specify, for example, the actual suction outputs $L_k$. Illustratively, the correlation matrices 1001a, 1001b may be each sections through the tensor formed in 900 that includes the matrices 901a, 901b, 901c, 901d, in the third dimension 93.

The correlation matrices 1001a, 1001b may also be collated as a higher-order tensor 1000, which in that case references the nature of the gas exchange parameter $Y_k$, $L_k$, for example, in the second dimension.

Reference is made hereinafter simply to the exchange matrix 1001a. However, what is described may also be analogously applicable to a correlation matrix $\hat{A}$ of the other correlation matrices described herein or a corresponding second-order or higher-order tensor $\hat{A}$.

Figure 11:
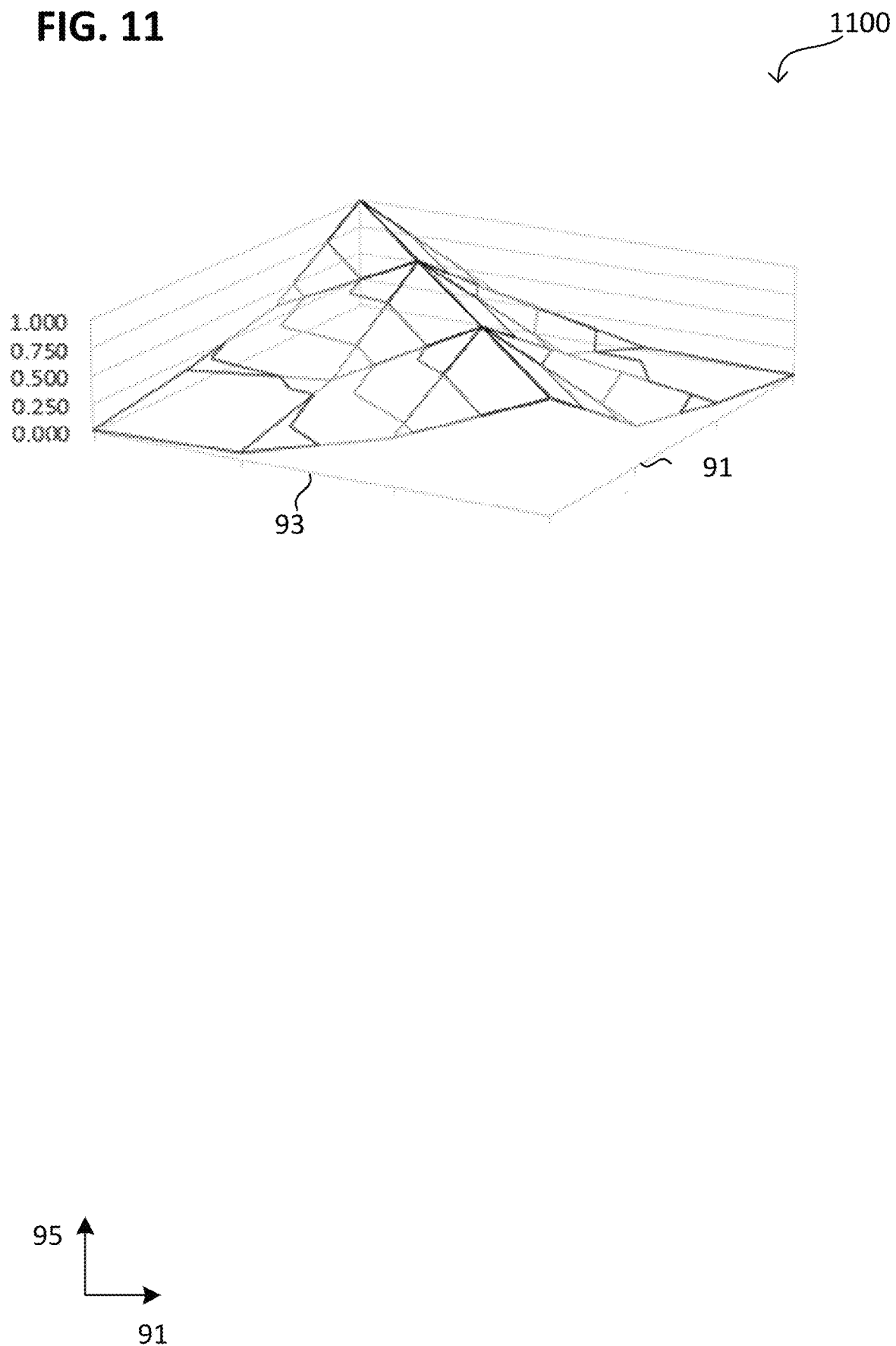
FIG. 11 an exchange matrix in a graph diagram.

FIG. 11 illustrates the exchange matrix 1001a in a graph diagram 1100.

Figure 12:
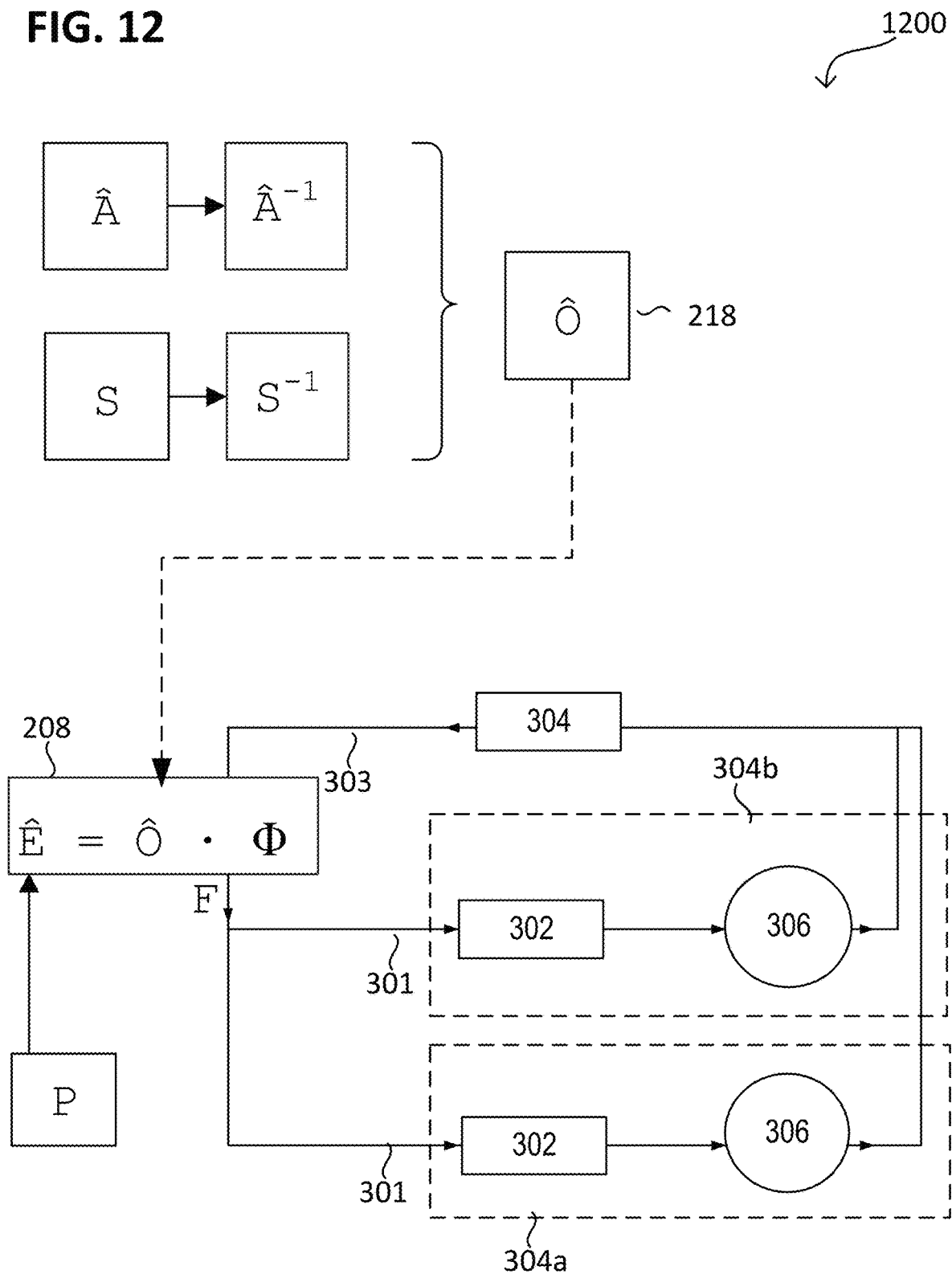
FIGS. 12 and 13 the forming of a correction element by the method in a schematic flow diagram.

FIG. 12 illustrates the forming of a correction element 218 which is represented hereinafter by a mathematical model $\hat{O}$ (referred to simply as correction element $\hat{O}$), in a schematic flow diagram 1200. More generally speaking, the mathematical model $\hat{O}$ may assign a second variable (for example the manipulated variable) to a first variable (for example a command variable) and, for example, may also have a more complex program or a simulation. With regard to the mathematical model $\hat{O}$, reference is made hereinafter simply to vectors, matrices and tensors.

In order to facilitate determining of the standard volume flow rate to be established on the basis of the actual pressure detected in the performance of the coating processes 304a, 304b, the correction element may, alternatively or additionally to the exchange matrix 1001a (exchange matrix $\hat{A}$ hereinafter), have the inverse $\hat{A}^{-1}$ of the exchange matrix $\hat{A}$ (also referred to as exchange inverse $\hat{A}^{-1}$).

If the exchange matrix $\hat{A}$ is not a square matrix, rather than the exchange inverse $\hat{A}^{-1}$, it is possible, for example, to use what is called the pseudoinverse of the exchange matrix $\hat{A}$.

The pseudoinverse of a matrix refers to a generalization of the inverse matrix to singular and nonsquare matrices, which is the reason why it is frequently also referred to as generalized inverse. For example, the pseudoinverse may include or be formed from a Drazin inverse, a Bott-Duffin inverse or a Moore-Penrose inverse. A matrix $\hat{I}$ may be the pseudoinverse $\hat{A}^{-1}$ of a matrix $\hat{A}$ precisely when it satisfies at least one (for example all) of the following relations: $\hat{A}\hat{I}\hat{A}=\hat{A}$ and $\hat{I}\hat{A}\hat{I}=\hat{I}$. The same applies to higher-order tensors.

Alternatively or additionally, the nonsquare matrix $\hat{A}$ may be used to form a square matrix $\hat{A}_q$, for example by eliminating or remedying the overdetermination thereof. Alternatively or additionally, all components (i.e., for example, one column) of the matrix $\hat{A}$ that have the lowest sum may be removed, for example recursively until the matrix $\hat{A}$ is square or at least a pseudoinverse may be formed. In a similar manner, it is possible to use only those exchange parameters that have the greatest leverage to form the correlation matrix $\hat{A}$.

In an analogous manner, the dimensions of the correlation matrix may have been fitted or may be fitted to the dimensions of the feedback variable and/or specified variable 316 of the control device 208, for example to the dimensions of the measurement data. For example, the feedback variable may take the form of an n-dimensional vector of the following form: {first actual pressure of the first coating process 304a, second actual pressure of the second coating process 304b, . . . , Kth actual pressure of the Kth coating process 304K}. Alternatively or additionally, the specified variable 316 may take the form of an n-dimensional vector of the following form: {first target pressure of the first coating process 304a, second target pressure of the second coating process 304b, . . . , Kth target pressure of the Kth coating process 304K}.

It may thus be provided, for example, that, for example, ($n \times n$)matrix·($n \times n$)matrix=($n \times n$)matrix; or ($n \times n$)matrix·($n \times m$)matrix=($m \times n$)matrix; or ($n \times m$)matrix·($n$)-vector=($m$)vector; or ($n \times n$)matrix·($n$)-vector=($n$)vector.

In an analogous manner, n control values to be set in the process group 700 may be combined as an n-dimensional control vector, for example as an n-dimensional vector of the following form: {first standard volume flow rate fed to the first coating process 304a, second standard volume flow rate fed to the second coating process 304b, . . . , Kth standard volume flow rate fed to the Kth coating process 304K}. If a spatial distribution of the pressure is additionally controlled in each coating process (also referred to as trimming), for example at m sites in the coating process, the control values may be combined as a second-order (n×m)-dimensional tensor or as a tensor of a higher order than two.

Reference is made hereinafter generally to a tensor, wherein the tensor may optionally be first-order (i.e. may consist of exactly one tensor component, e.g. a scalar), second-order (i.e. may be a matrix), third-order, or may have an order of more than three. The dimension n (or m) of each vector defined by the tensor may generally be two or more, for example three or more, for example four or more, for example five or more, etc.

If the process group 700 is to be controlled according to exactly one specified variable as first-order tensor, i.e. a group command variable (for example according to a group target setpoint), the correction element may multiply the group command variable by an n-dimensional unit tensor $\hat{I}$ (for example unit vector) in order to provide the n-dimensional specified variable. In an analogous manner, it is alternatively possible to provide a specified variable as a higher-order (for example second-order) tensor.

If a coating process of the process group 700 is removed from the group control by means of the correction element, the components thereof may be set to zero or the dimensions may be reduced to n−1. In this way, the correction element may be fitted to the prevailing configuration (or variation thereof) of the process group 700 without having to undertake complex calibration.

For example, the control tensor E may satisfy the following relation: $\hat{E}=\hat{O}\cdot\Phi$, where $\hat{O}$ is the correction element and $\Phi$ is the specified parameter (for example having one or more than one command variable), for example the group target setpoint $SA_G$. The correction element $\hat{O}$ may have, for example, the exchange inverse $\hat{A}$ and optionally the inverse $S^{-1}$ of the suction matrix, for example the product thereof.

For example, a vectorial gas flow F may be used as control tensor $\hat{E}$, where $F=(F_a, F_b, \ldots, F_K)$. In that case, it is possible to use a vectorial pressure P as specified parameter, where $P=(P_a, P_b, \ldots, P_K)$. It may then be the case that $F=\hat{O}\cdot P$. Where the correction element may be $\hat{O}=\hat{A}^{-1}\cdot S^{-1}$.

Optionally, it may be the case that $P=\hat{I}\cdot SP$, where SP may be the scalar pressure used as the group command variable $SA_G$. Alternatively, it is possible to multiply an (n×1)-dimensional correction element $\hat{O}$ by the scalar pressure SP, such that an n-dimensional control tensor $\hat{E}$ is determined.

The correction element $\hat{O}$ thus obtained may relate the components of the control tensor $\hat{E}$ (for example the first manipulated variable $S_a$ and the second manipulated variable $S_b$) to one another, for example via the relation $\hat{E}=\hat{O}\cdot\Phi$.

For example, a first component $\hat{O}_a$ of the correction element $\hat{O}$ may satisfy the relation $\hat{O}_a(IA_G, SA_G)=S_a$, hence parametrizing $S_a=S_a(IA_G, SA_G)$. For example, a second component $\hat{O}_b$ may satisfy the relation $\hat{O}_b(IA_G, SA_G)=S_b$, hence parametrizing $S_b=S_b(IA_G, SA_G)$. The parametrization via the group actual setpoint $IA_G$ and/or the group target setpoint $SA_G$ may thus relate the first manipulated variable $S_a$ and the second manipulated variable $S_b$ to one another. For example, $V(S_a)=S_b$ may be satisfied when the relation $V(\hat{O}_a(IA_G, SA_G))=\hat{O}_b(IA_G, SA_G)$ or more generally $V\hat{O}_a=\hat{O}_b$ is satisfied, with the result that $V=\hat{O}_b\hat{O}_a^{-1}$. It is of course also possible to implement a different relationship that relates the first manipulated variable $S_a$ and the second manipulated variable $S_b$ to one another.

For example, it may be the case that $S_b=V(S_a)=S_a-D$ or $S_b=V(S_a)=S_a\cdot s$, where s may be a scalar factor that has the effect that the $S_a/S_b$ ratio remains constant. It is alternatively possible to select another kind of relationship V.

The correction element $\hat{O}$ provided in this way may be stored in a control device 208 which then controls the process group by means of the first manipulated variable and the second manipulated variable and using the correction element $\hat{O}$ and hence implements the group control device.

Figure 13:
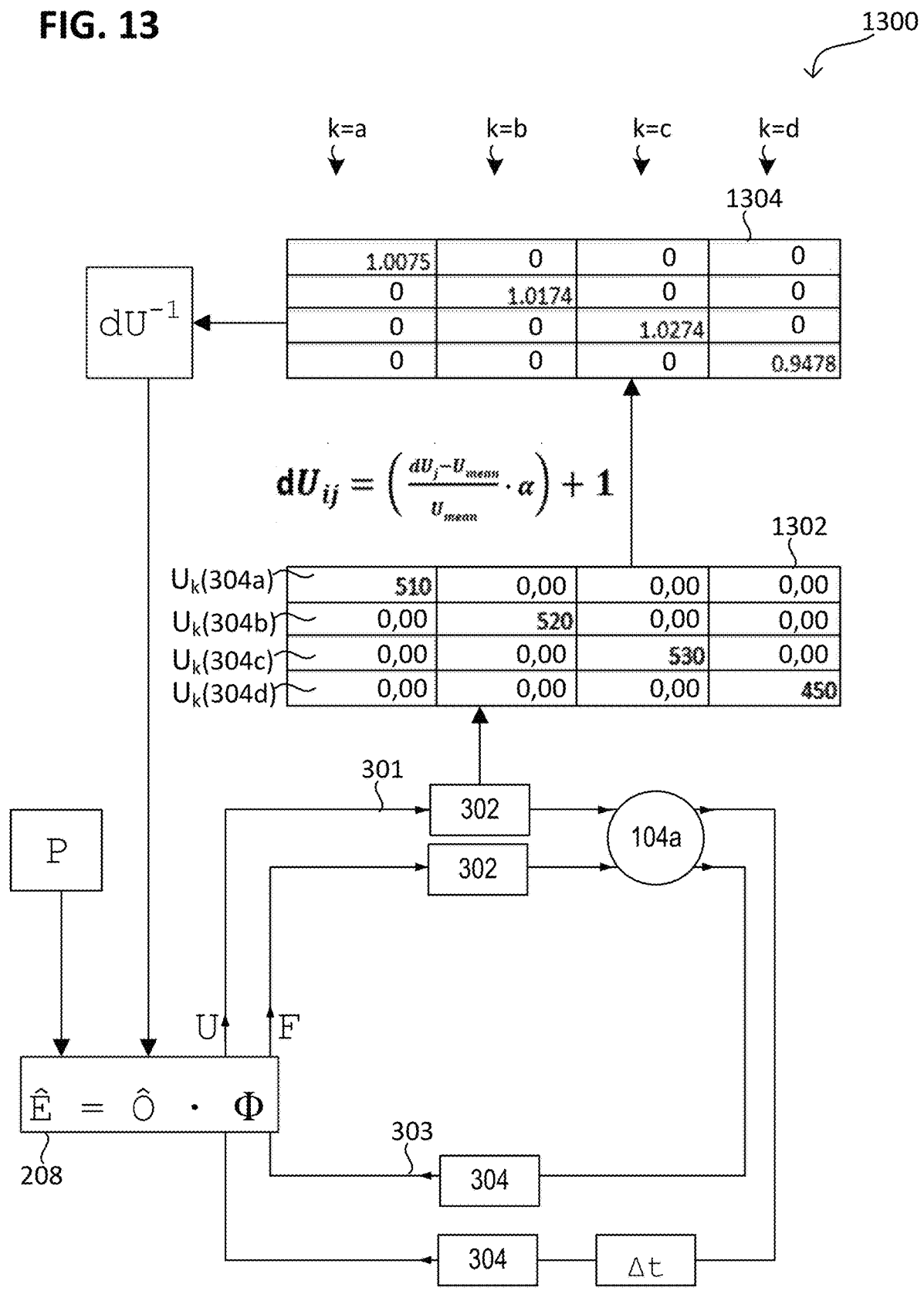

FIG. 13 illustrates the forming (for example updating) of a correction element $\hat{O}$ in a schematic flow diagram 1300.

There follows a description of an example of a correction element $\hat{O}$ of a cascaded closed-loop control circuit with reference to the burning voltage U as additional manipulated variable of each coating process 304a, 304b. What is described may alternatively be analogously applicable to another additional manipulated variable of each coating process. Illustratively, the burning voltage U may represent the power consumption of each of the coating processes.

On the basis of $F=\hat{O}\cdot P$, with the correction element $\hat{O}=\hat{A}^{-1}\cdot S^{-1}$, it is possible to control the process group 200, 700, for example each of the coating processes 304a, 304b, . . . , 304K. In the performance of the coating processes 304a, 304b, . . . , 304K controlled in this way, it is possible to detect the burning voltage U for each of the coating processes 304a, 304b, . . . , 304K and collate it in a matrix 1302 (also referred to as voltage matrix). The voltage matrix may reference, for example, the coating processes 304a, 304b, . . . , 304K in a first dimension and the coating apparatuses 114a, 114b, . . . , 114K in a second dimension, such that this has solely diagonal components $U_{jj}=U_j$. On the basis of the voltage matrix, it is possible to determine a variation matrix 1304, for example on the basis of a variation calculation. The variation calculation may include, for example, determining a variation $dU_{ji}$ of each component $U_{ji}$ of the voltage matrix, for example according to the following relation:

$$dU_{ij} = \left(\frac{dU_j - U_{mean}}{U_{mean}} \cdot \alpha\right) + 1$$

$U_{mean}$ here may mean the average of the components $U_{ji}$ of the voltage matrix and α may represent the leverage (i.e. this reflects the component of the proportional element, i.e. P element). For example, α may be 0.5.

The inverse $dU^{-1}$ of the variation matrix 1304 may be added to the correction element $\hat{O}$, and so it is then the case that $\hat{O}=\hat{A}^{-1}\cdot dU^{-1}\cdot S^{-1}$. The correction element $\hat{O}$ thus updated takes into account the cascading of the closed-loop control zone. An adjustment of α may be used for fine tuning, for example via a user interface.

There follows a description of various examples that relate to descriptions above and what is shown in the figures.

Example 1 is a method of operating a process group that performs at least a first reactive coating process and a second reactive coating process, said method including: coating of a substrate by means of the first reactive coating process and by means of the second reactive coating process; closed-loop control of the process group by means of a first manipulated variable (also referred to as first manipulated process input) from the first coating process and a second manipulated variable (also referred to as second manipulated process input) from the second coating process and using a correction element; wherein the correction element relates the first manipulated variable and the second manipulated variable to one another in such a way that their control values may differ from one another (i.e. the control value of the first manipulated variable may be different from the control value of the second manipulated variable, for example at the same time).

Example 2 is the method according to example 1, further including: supplying the process group with gas, wherein the coating includes forming a layer on the substrate that includes at least one constituent of the gas.

Example 3 is the method according to example 2, wherein the first manipulated variable represents a rate of the gas which is supplied to the first reactive coating process; and/or wherein the second manipulated variable represents a rate of the gas which is supplied to the second reactive coating process.

Example 4 is the method according to any of examples 1 to 3, wherein a first controlled variable of the first coating process is influenced by the first manipulated variable and a second controlled variable of the coating process is influenced by the second manipulated variable, wherein the first manipulated variable (for example the control value thereof) has a greater variance (e.g., difference) from the second manipulated variable (for example the control value thereof) than the first controlled variable (for example the actual value thereof) has from the second controlled variable (for example the actual value thereof).

Example 5 is the method according to any of examples 1 to 4, wherein the coating of the substrate includes forming a first sublayer on the substrate by means of the first reactive coating process and forming a second sublayer on the first sublayer by means of the second reactive coating process.

Example 6 is the method according to any of examples 1 to 5, wherein the coating of the substrate includes forming a layer (for example a transparent or opaque layer) on the substrate, and/or wherein a reaction product of the first coating process and/or of the second coating process or the layer is transparent or opaque; and/or wherein a reaction product of the first coating process and/or of the second coating process or the layer is substoichiometric (i.e. has lattice vacancies).

Example 7 is the method according to any of examples 1 to 6, wherein the first reactive coating process and the second reactive coating process are gas-separated from one another.

Example 8 is the method according to any of examples 1 to 7, wherein the first reactive coating process and the second reactive coating process are effected in different vacuum chambers (for example in different compartments within a chamber housing) of the process group.

Example 9 is the method according to any of examples 1 to 8, wherein the process group performs one or more than one additional reactive coating process, of which each coating process is controlled by means of an additional manipulated variable, wherein the correction element relates the additional manipulated variable to the first manipulated variable and the second manipulated variable in such a way that the control values thereof differ from one another in pairs.

Example 10 is the method according to any of examples 1 to 9, wherein the correction element relates the first manipulated variable and the second manipulated variable to one another in such a way that these have a mutual difference that is invariant (for example with respect to the closed-loop control operation (e.g., the closed-loop controlling)), or a mutual ratio that is invariant (for example with respect to the closed-loop control operation (e.g., the closed-loop controlling)).

Example 11 is the method according to any of examples 1 to 10, wherein the correction element relates the first manipulated variable and the second manipulated variable to the same reference parameter (for example in parametrized form), wherein, for example, the relationships of the reference parameter to the first manipulated variable and to the second manipulated variable have a linear dependence on one another, wherein, for example, the correction element maps the reference parameter onto the first manipulated variable and the second manipulated variable.

Example 12 is the method according to example 11, wherein the reference parameter is a group command variable (also referred to as "group setpoint parameter", "group reference variable" or as "group setpoint variable") of the process group.

Example 13 is the method according to any of examples 1 to 12, wherein the correction element represents an interaction (for example a gas exchange) between the first coating process and the second coating process.

Example 14 is the method according to example 13, wherein the correction element has a first data tensor that has at least a first tensor component that represents the effect of the first coating process on the second coating process (e.g., the part of their interaction with each other that is directed to the second coating process); and has at least a second tensor component that represents the effect of the second coating process on the first coating process (e.g., the part of their interaction with each other that is directed to the first coating process).

Example 15 is the method according to any of examples 1 to 14, wherein the correction element additionally takes into account a gas flow which is withdrawn from the first coating process and/or the second coating process.

Example 16 is the method according to example 15, wherein the correction element has a second data tensor that has at least a first tensor component that represents the gas flow withdrawn from the first coating process; and has at least a second tensor component that represents the gas flow withdrawn from the second coating process, wherein, for example, the gas flow is withdrawn from the first coating process or the second coating process through a pump connection that directly adjoins the respective coating process, wherein, for example, a chamber cover, that bounds the coating process (or the corresponding coating region), includes the pump connection and/or bears the coating apparatus by means of which the coating process is conducted (for example a pumped magnetron).

Example 17 is the method according to any of examples 1 to 16, wherein the correction element additionally takes into of an electrical power consumption of the first coating process and/or the second coating process.

Example 18 is the method according to example 17, wherein the correction element has a third data tensor that has at least a first tensor component that represents the power consumption of the first coating process; and has at least a second tensor component that represents the power consumption of the second coating process.

Example 19 is the method according to any of examples 1 to 18, wherein the first manipulated variable and/or the second manipulated variable (for example have multiple components that) represent a spatial gas distribution of the first or second coating process.

Example 20 is the method according to any of examples 1 to 19, further including: detecting a property of the coated substrate; varying a group command variable of the process group on the basis of the property of the coated substrate, wherein the first manipulated variable and/or the second manipulated variable is varied on the basis of the group command variable.

Example 21 is the method according to any of examples 1 to 20, wherein the first reactive coating process and/or the second reactive coating process is effected by means of a physical vapor deposition, for example by means of sputtering.

Example 22 is a method of calibrating a process group having at least a first coating process and a second coating process, said method including: determining (e.g., ascertaining) a first interaction between a first manipulated variable (for example gas flow) of the first coating process and an actual state (for example pressure) of the second coating process; determining (e.g., ascertaining) a second interaction between a second manipulated variable (for example gas flow) of the second coating process and an actual state (for example pressure) of the first coating process; forming a correction element on the basis of the first interaction determined (e.g., ascertained) and second interaction determined (e.g., ascertained); wherein the correction element relates the first manipulated variable and the second manipulated variable to one another in such a way that their control values may differ from one another; providing a group control device configured to control the process group by means of the first manipulated variable and the second manipulated variable and using a correction element.

Example 23 is a group control device for controlling a process group, wherein the group control device includes one or more than one processor configured to perform the following: closed-loop control of a first coating process of the process group by means of a first manipulated variable and using a correction element; closed-loop control of a second coating process of the process group by means of a second manipulated variable and using the correction element; wherein the correction element relates the first manipulated variable and the second manipulated variable to one another in such a way that their control values may differ from one another.

What is claimed is:

1. A method of operating a process group that performs at least a first reactive coating process and a second reactive coating process, said method comprising:
   coating a substrate by the first reactive coating process and by the second reactive coating process;
   closed-loop controlling the process group by a first manipulated variable of the first coating process and a second manipulated variable of the second coating process and using a correction element;
   wherein the correction element relates the first manipulated variable and the second manipulated variable to one another in such a way that their control values are different from one another.

2. The method as claimed in claim 1, further comprising:
   supplying the process group with gas, wherein the coating comprises forming a layer on the substrate that comprises at least one constituent of the gas.

3. The method as claimed in claim 2,
   wherein the first manipulated variable represents a rate of the gas which is supplied to the first reactive coating process; and/or
   wherein the second manipulated variable represents a rate of the gas which is supplied to the second reactive coating process.

4. The method as claimed in claim 1, wherein the coating of the substrate comprises forming a first sublayer on the substrate by the first reactive coating process and forming a second sublayer on the first sublayer by the second reactive coating process.

5. The method as claimed in claim 1, wherein the first reactive coating process and the second reactive coating process are conducted in different vacuum chambers of the process group.

6. The method as claimed in claim 1, wherein the correction element relates the first manipulated variable and the second manipulated variable to one another in such a way that these have:
   a mutual difference that is invariant with respect to the closed-loop controlling, or
   a mutual ratio that is invariant with respect to the closed-loop controlling.

7. The method as claimed in claim 1, wherein the correction element relates a reference parameter to the first manipulated variable and the reference parameter to the second manipulated variable.

8. The method as claimed in claim 1, wherein the correction element represents an interaction between the first coating process and the second coating process.

9. The method as claimed in claim 8, wherein the correction element has a first data tensor that
   has at least a first tensor component that represents an effect of the first coating process on the second coating process; and
   has at least a second tensor component that represents an effect of the second coating process on the first coating process.

10. The method as claimed in claim 1, wherein the correction element further takes into account a gas flow, which is withdrawn from the first coating process and/or the second coating process.

11. The method as claimed in claim 10, wherein the gas flow is withdrawn from the first coating process or the second coating process through a pump connection that directly adjoins the respective coating process.

12. The method as claimed in claim 10, wherein the correction element has a second data tensor that
   has at least a first tensor component that represents the gas flow withdrawn from the first coating process; and
   has at least a second tensor component that represents the gas flow withdrawn from the second coating process.

13. The method as claimed in claim 1, wherein the correction element additionally takes account of an electrical power consumption of the first coating process and/or of the second coating process.

14. The method as claimed in claim 13, wherein the correction element has a third data tensor that
   has at least a first tensor component that represents the power consumption of the first coating process; and
   has at least a second tensor component that represents the power consumption of the second coating process.

15. The method as claimed in claim 1, wherein the first manipulated variable and/or the second manipulated variable represent a spatial gas distribution.

16. The method as claimed in claim 1, wherein the first reactive coating process and/or the second reactive coating process are effected by a physical vapor deposition.

17. A method of calibrating a process group having at least a first coating process and a second coating process, said method comprising:
- determining a first interaction between a first manipulated variable of the first coating process and an actual state of the second coating process;
- determining a second interaction between a second manipulated variable of the second coating process and an actual state of the first coating process;
- forming a correction element on the basis of the first interaction as determined and second interaction as determined;
- wherein the correction element relates the first manipulated variable and the second manipulated variable to one another in such a way that their control values are different from one another;
- controlling the process group to, based on the first manipulated variable, the second manipulated variable, and the correction element, coat a substrate using the first coating process and the second coating process.

* * * * *